(12) United States Patent
Yang et al.

(10) Patent No.: US 12,720,727 B2
(45) Date of Patent: Aug. 25, 2026

(54) INTEGRATED CIRCUIT DEVICES AND METHODS OF MANUFACTURING THE SAME

(71) Applicant: SAMSUNG ELECTRONICS CO., LTD., Suwon-si (KR)

(72) Inventors: Dongkwan Yang, Seoul (KR); Jaybok Choi, Yongin-si (KR); Yongseok Ahn, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1037 days.

(21) Appl. No.: 17/839,344

(22) Filed: Jun. 13, 2022

(65) Prior Publication Data

US 2023/0005926 A1 Jan. 5, 2023

(30) Foreign Application Priority Data

Jul. 5, 2021 (KR) ........................ 10-2021-0088103

(51) Int. Cl.
*H10B 12/00* (2023.01)

(52) U.S. Cl.
CPC ........... *H10B 12/315* (2023.02); *H10B 12/34* (2023.02); *H10B 12/482* (2023.02); *H10B 12/50* (2023.02)

(58) Field of Classification Search
CPC .. H10B 12/0335; H10B 12/09; H10B 12/315; H10B 12/34; H10B 12/482; H10B 12/50
See application file for complete search history.

(56) References Cited

U.S. PATENT DOCUMENTS

| | | | |
|---|---|---|---|
| 7,670,942 | B2 | 3/2010 | Kim et al. |
| 7,799,643 | B2 | 9/2010 | Kang et al. |
| 9,099,473 | B2 | 8/2015 | Kim et al. |
| 9,793,472 | B2 | 10/2017 | Chung et al. |
| 10,186,513 | B2 | 1/2019 | Chang et al. |
| 10,566,333 | B2 | 2/2020 | Lee et al. |

(Continued)

FOREIGN PATENT DOCUMENTS

| | | |
|---|---|---|
| KR | 1020080095669 | 10/2008 |
| KR | 10-2014-0030384 A | 3/2014 |
| KR | 10-2020-0074659 A | 6/2020 |

OTHER PUBLICATIONS

Notice of Allowance in Taiwanese Appln. No. 111124953, mailed on Jun. 2, 2023, 8 pages (with English translation).

(Continued)

*Primary Examiner* — Meiya Li
(74) *Attorney, Agent, or Firm* — Fish & Richardson P.C.

(57) ABSTRACT

An integrated circuit device includes: a plurality of bit lines extending on a substrate in a first direction parallel to an upper surface of the substrate; a plurality of insulation capping structures respectively arranged on the plurality of bit lines, extending in the first direction, and including a first insulating material; a conductive plug between two adjacent bit lines among the plurality of bit lines on the substrate; a top capping layer arranged on the plurality of insulation capping structures and including a second insulating material different from the first insulating material; and a landing pad arranged on the conductive plug and arranged on a sidewall of a corresponding insulation capping structure among the plurality of insulation capping structures and the top capping layer.

18 Claims, 36 Drawing Sheets

(56) References Cited

U.S. PATENT DOCUMENTS

| | | | | |
|---|---|---|---|---|
| 11,189,570 | B2 | 11/2021 | Kim et al. | |
| 2014/0377934 | A1 | 12/2014 | Takesako | |
| 2015/0371895 | A1 | 12/2015 | Yokomichi | |
| 2017/0317079 | A1* | 11/2017 | Kim | H10D 64/017 |
| 2020/0194374 | A1* | 6/2020 | Kim | H10B 12/315 |
| 2021/0005620 | A1 | 1/2021 | Kim et al. | |
| 2021/0035983 | A1 | 2/2021 | Song et al. | |
| 2023/0070835 | A1* | 3/2023 | Lee | H10B 12/50 |
| 2023/0403846 | A1* | 12/2023 | Jiang | H10B 12/482 |

OTHER PUBLICATIONS

Office Action in Korean Appln. No. 10-2021-0088103, mailed on Mar. 19, 2025, 16 pages (with Machine Translation).

* cited by examiner 200
236
240P1
240P2
240
230
250
234
Y1 - Y1'
X1 - X1'
286
284
282
280
270
262
260
232
250
220
222
212
210
Z
Y
X

INTEGRATED CIRCUIT DEVICES AND METHODS OF MANUFACTURING THE SAME

CROSS-REFERENCE TO RELATED APPLICATION

This application is based on and claims priority under 35 U.S.C. § 119 to Korean Patent Application No. 10-2021-0088103, filed on Jul. 5, 2021 in the Korean Intellectual Property Office, the disclosure of which is incorporated by reference herein in its entirety.

BACKGROUND

The inventive concept relates to integrated circuit devices and methods of manufacturing the same, and more particularly, to an integrated circuit device including a bit line and a method of manufacturing the integrated circuit device.

As integrated circuit devices are downscaled, the size of an individual circuit pattern necessary for implementing the integrated circuit devices is further reduced. In addition, as the integrated circuit devices became highly integrated, a line width of a bit line decreases and the difficulty in operation of forming a contact between bit lines increases.

SUMMARY

The inventive concept provides an integrated circuit device capable of reducing the difficulty of an operation of forming a contact between bit lines.

The inventive concept provides a method of manufacturing an integrated circuit device which is capable of reducing the difficulty of the operation of forming a contact between bit lines.

According to an aspect of the inventive concept, there is provided an integrated circuit device including: a plurality of bit lines extending on a substrate in a first direction parallel to an upper surface of the substrate; a plurality of insulation capping structures respectively arranged on the plurality of bit lines, extending in the first direction, and including a first insulating material; a conductive plug between two adjacent bit lines among the plurality of bit lines on the substrate; a top capping layer arranged on the plurality of insulation capping structures and including a second insulating material different from the first insulating material; and a landing pad arranged on the conductive plug and arranged on a sidewall of a corresponding insulation capping structure among the plurality of insulation capping structures and the top capping layer.

According to another aspect of the inventive concept, there is provided an integrated circuit device including: a plurality of bit lines extending on a substrate in a first direction parallel to an upper surface of the substrate; a plurality of insulation capping structures respectively arranged on the plurality of bit lines, extending in the first direction, and including a first insulating material; a plurality of insulating fences arranged between two adjacent insulation capping structures among the plurality of insulation capping structures and spaced apart from one another in the first direction; a top capping layer arranged on the plurality of insulation capping structures and the plurality of insulating fences and including a second insulating material different from the first insulating material; a conductive plug between two adjacent bit lines among the plurality of bit lines and between two adjacent insulating fences among the plurality of insulating fences; and a landing pad arranged on the conductive plug and covering at least a portion of an upper surface of the top capping layer.

According to another aspect of the inventive concept, there is provided an integrated circuit device including: a plurality of bit lines extending on a substrate in a first direction parallel to an upper surface of the substrate; a plurality of insulation capping structures respectively arranged on the plurality of bit lines, extending in the first direction, and including a first insulating material; a plurality of insulating fences arranged between two adjacent insulation capping structures among the plurality of insulation capping structures and spaced apart from one another in the first direction; a top capping layer arranged on the plurality of insulation capping structures and the plurality of insulating fences and including a second insulating material different from the first insulating material; a conductive plug between two adjacent bit lines among the plurality of bit lines and between two adjacent insulating fences among the plurality of insulating fences; a landing pad arranged on the conductive plug and covering at least a portion of an upper surface of the top capping layer; and an insulating pattern surrounding a sidewall of the landing pad, wherein the second insulating material includes a material having an etch selectivity with respect to the first insulating material.

BRIEF DESCRIPTION OF THE DRAWINGS

Embodiments of the inventive concept will be more clearly understood from the following detailed description taken in conjunction with the accompanying drawings in which:

FIGS. 5A to 19B are cross-sectional views sequentially showing the operations of a method of manufacturing an integrated circuit device according to exemplary embodiments; in particular, FIGS. 5A, 6A, 7A, 8A, 9A, 10 to 13, 14A, 15A, 16, 17A, 18A, and 19A are cross-sectional views corresponding to cross-sections taken along lines A1-A1' and A2-A2' shown in FIG. 1, and FIGS. 5B, 6B, 7B, 8B, 9B, 14B, 15B, 17B, 18B, and 19B are cross-sectional views corresponding to a cross-section taken along line B-B' shown in FIG. 1;

DETAILED DESCRIPTION OF THE PREFERRED EMBODIMENTS

Hereinafter, exemplary embodiments of the inventive concept are described in detail in conjunction with the accompanying drawings.

Figure 1:
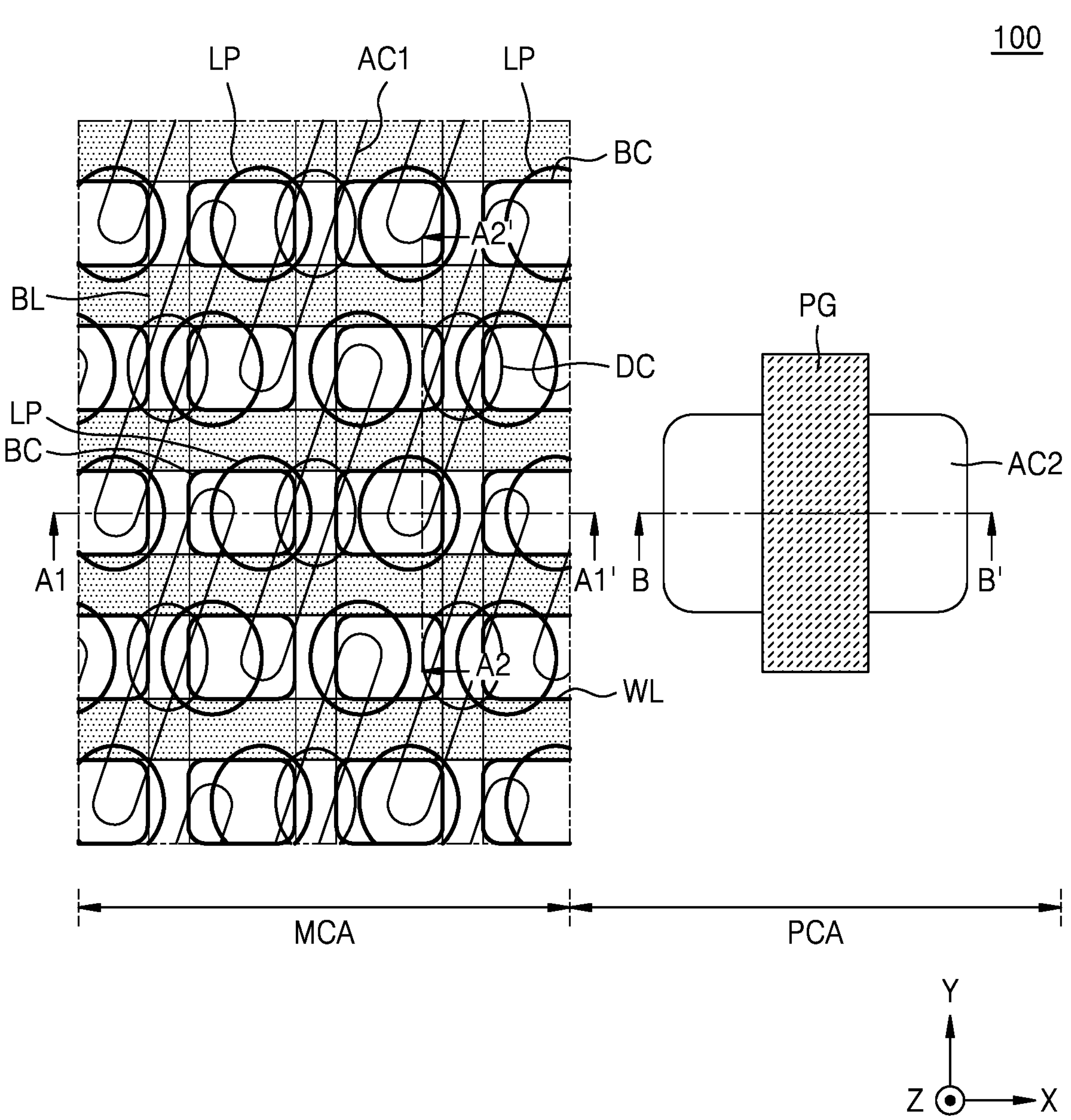
FIG. 1 is a layout diagram illustrating an integrated circuit device according to exemplary embodiments.
Figure 2A:
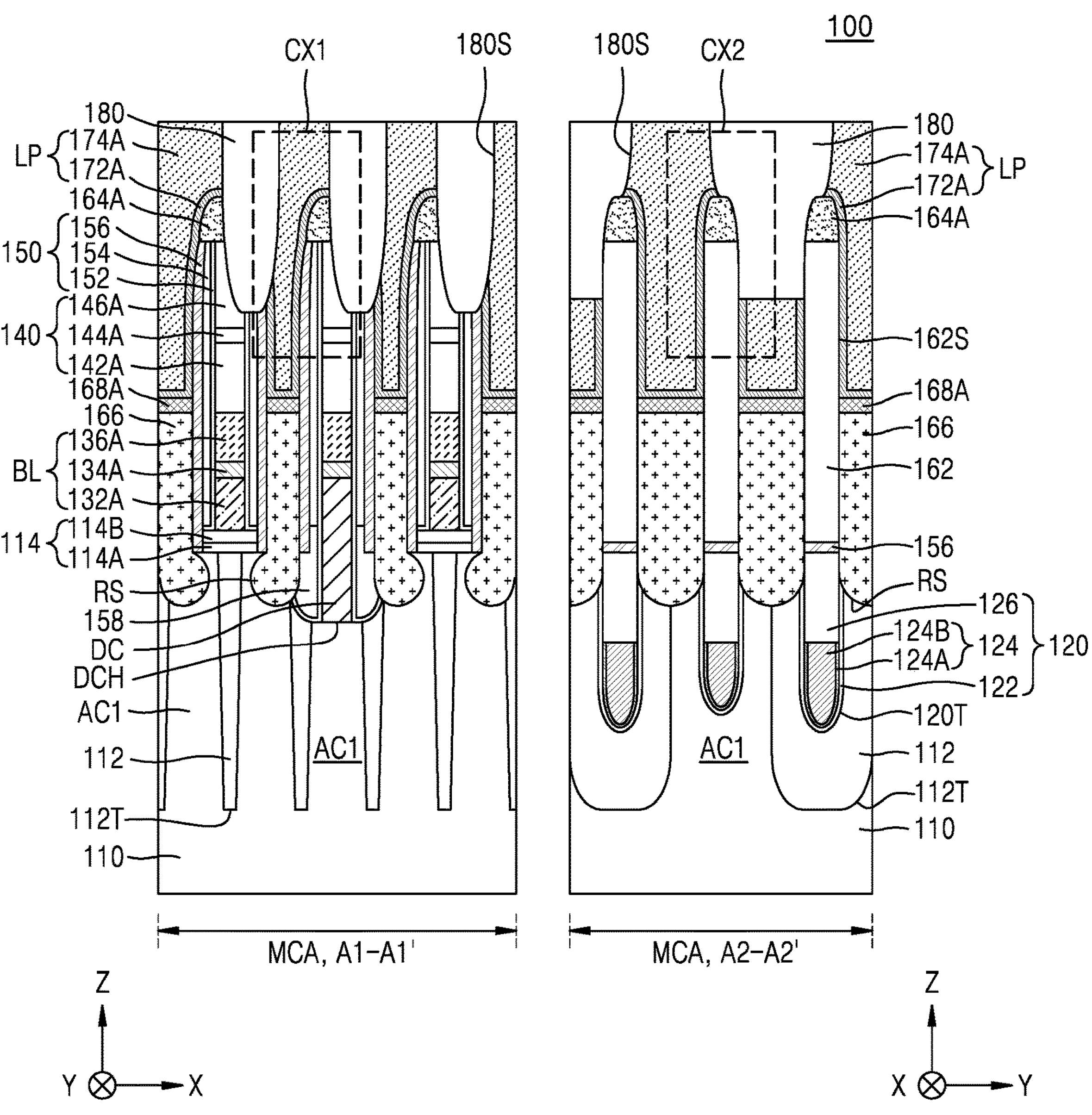
FIG. 2A illustrates cross-sectional views taken along lines A1-A1' and A2-A2' shown in FIG. 1.
Figure 2B:
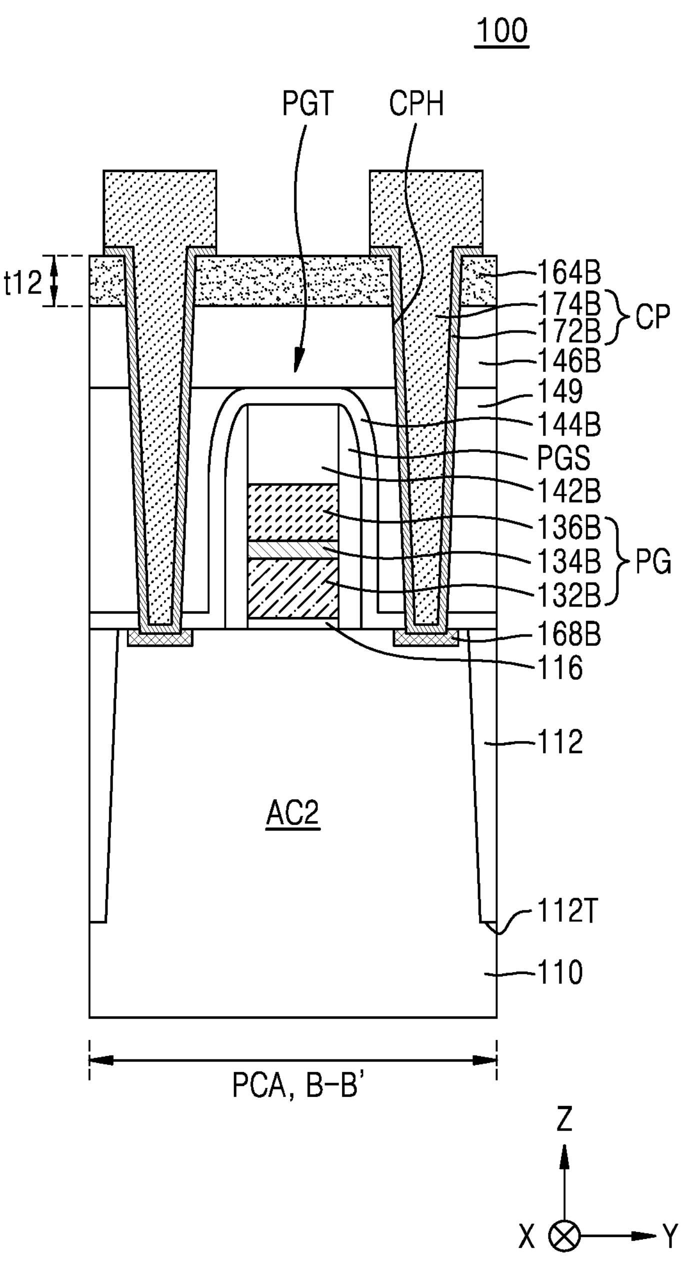
FIG. 2B is a cross-sectional view taken along line B-B' shown in FIG. 1.
Figure 3:
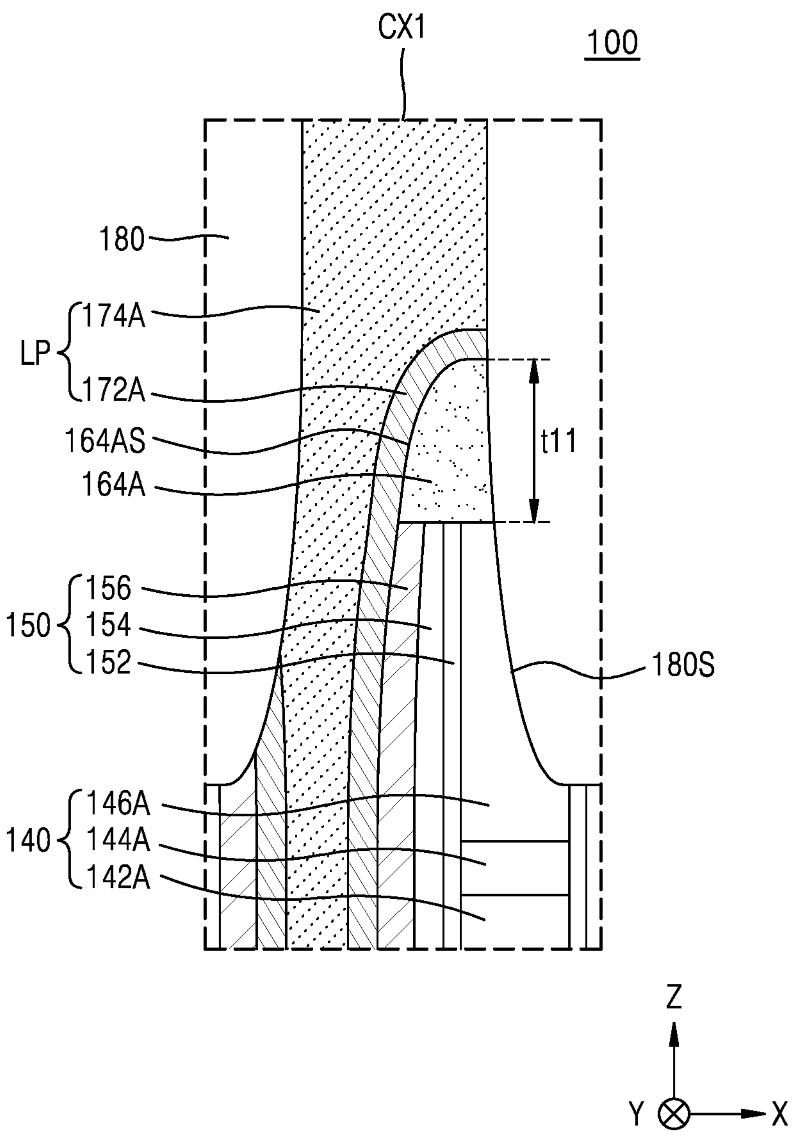
FIG. 3 is an enlarged view of a region CX1 of FIG. 2A.
Figure 4:
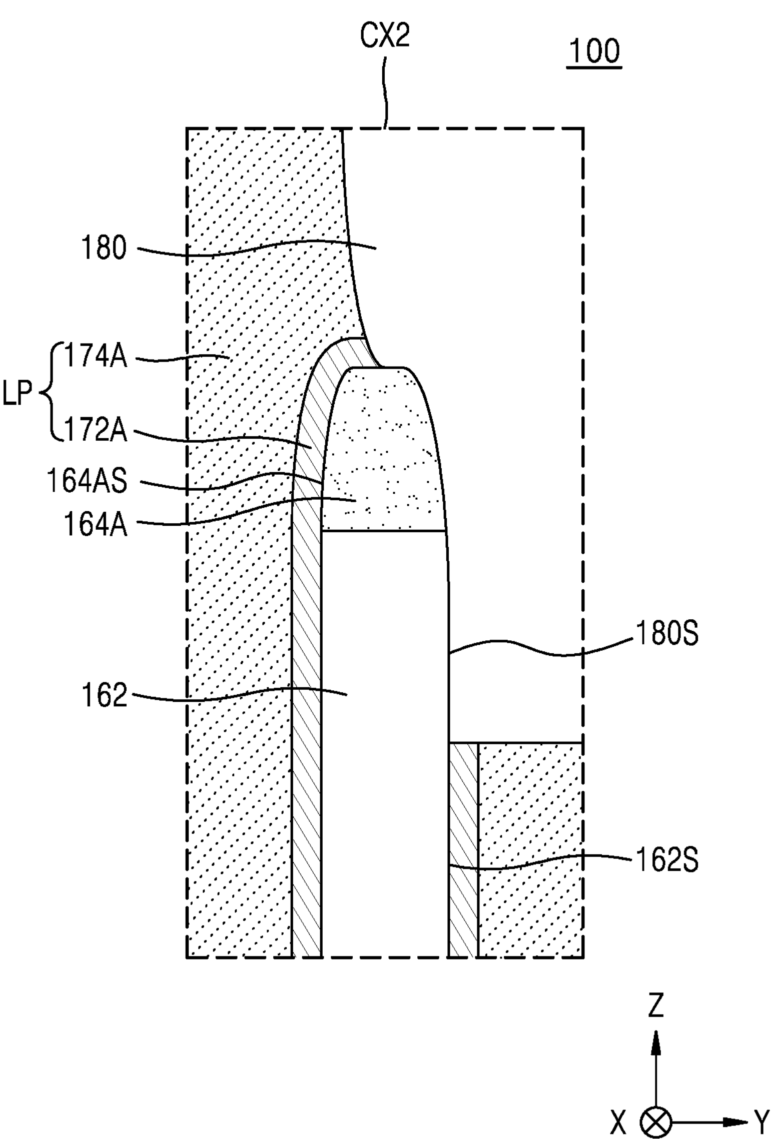
FIG. 4 is an enlarged view of a region CX2 of FIG. 2A.

FIG. 1 is a layout diagram illustrating an integrated circuit device 100 according to an embodiment. FIG. 2A illustrates cross-sectional views taken along lines A1-A1' and A2-A2' shown in FIG. 1, and FIG. 2B is a cross-sectional view taken along line B-B' shown in FIG. 1. FIG. 3 is an enlarged view of a region CX1 of FIG. 2A, and FIG. 4 is an enlarged view of a region CX2 of FIG. 2A.

Referring to FIGS. 1 to 3, the integrated circuit device 100 may include a substrate 110 including a cell array area MCA and a peripheral circuit area PCA. A device isolation trench 112T may be formed in the substrate 110, and a device isolation layer 112 may be formed in the device isolation trench 112T. Based on the device isolation layer 112, a plurality of first active areas AC1 may be defined in the substrate 110 in the cell array area MCA, and a second active area AC2 may be defined in the substrate 110 in the peripheral circuit area PCA.

Each of the plurality of first active areas AC1 may be arranged to have a long axis diagonal to a first horizontal direction X and a second horizontal direction Y. A plurality of word lines WL may extend in parallel with one another in the first horizontal direction X across the plurality of first active areas AC1. A plurality of bit lines BL may extend in parallel with one another in the second horizontal direction Y on the plurality of word lines WL. The plurality of bit lines BL may be respectively connected to the plurality of first active areas AC1 through a direct contact DC.

A plurality of buried contacts BC may be formed between two adjacent bit lines BL among the plurality of bit lines BL. The plurality of buried contacts BC may be linearly arranged in the first horizontal direction X and the second horizontal direction Y. A plurality of landing pads LP may be formed on the plurality of buried contacts BC. The plurality of buried contacts BC and the plurality of landing pads LP may connect lower electrodes (not shown) of capacitors formed on the plurality of bit lines BL to the plurality of first active areas AC1. The plurality of landing pads LP may partially overlap the plurality of buried contacts BC, respectively.

The substrate 110 may include silicon, and for example, may include single crystalline silicon, polycrystalline silicon, or amorphous silicon. In some other embodiments, the substrate 110 may include at least one material selected from among germanium (Ge), silicon germanium (SiGe), silicon carbide (SiC), gallium arsenide (GaAs), indium arsenide (InAs), and indium phosphide (InP). In some embodiments, the substrate 110 may include a conductive area, for example, an impurity-doped well or an impurity-doped structure. The device isolation layer 112 may include an oxide film, a nitride film, or a combination thereof.

In the cell array area MCA, a plurality of word line trenches 120T extending in the first horizontal direction X may be formed in the substrate 110, and a plurality of buried gate structures 120 may be arranged in the plurality of word line trenches 120T. Each of the plurality of buried gate structures 120 may include a gate dielectric layer 122, a buried gate electrode 124, and a capping insulation layer 126. The buried gate electrodes 124 included in the plurality of buried gate structures 120 may correspond to the plurality of word lines WL shown in FIG. 1. The gate dielectric layer 122 may include a silicon oxide film, a silicon nitride film, a silicon oxynitride film, an oxide/nitride/oxide (ONO) film, or a high-k dielectric film having a higher dielectric constant than that of the silicon oxide film. The buried gate electrode 124 may include a work function adjustment layer 124A conformally arranged on a lower inner wall of each of the plurality of word line trenches 120T, and a buried conductive layer 124B filling the lower inner wall of each of the plurality of word line trenches 120T. For example, the work function adjustment layer 124A may include a metal, a metal nitride, or a metal carbide such as titanium (Ti), titanium nitride (TiN), titanium aluminum nitride (TiAlN), titanium aluminum carbide (TiAlC), titanium aluminum carbon nitride (TiAlCN), titanium silicon carbon nitride (TiSiCN), tantalum (Ta), tantalum nitride (TaN), tantalum aluminum nitride (TaAlN), tantalum aluminum carbon nitride (TaAlCN), and tantalum silicon carbon nitride (TaSiCN), and the buried conductive layer 124B may include at least one of tungsten (W), tungsten nitride (WN), TiN, TaN, and doped polysilicon. The capping insulation layer 126 may include silicon oxide, silicon nitride, silicon oxynitride, or a combination thereof.

A buffer layer 114 may be formed on the substrate 110 in the cell array area MCA. The buffer layer 114 may include a first insulating layer 114A and a second insulating layer 114B. Each of the first insulating layer 114A and the second insulating layer 114B may include an oxide film, a nitride film, or a combination thereof.

A plurality of direct contacts DC may be formed in a plurality of direct contact holes DCH on the substrate 110. The plurality of direct contacts DC may be respectively connected to the plurality of first active areas AC1. The plurality of direct contacts DC may each include doped polysilicon. For example, the plurality of direct contacts DC may each include polysilicon including n-type impurities, such as phosphorous (P), arsenic (As), bismuth (Bi), and antimony (Sb), at relatively high concentrations.

The plurality of bit lines BL may extend in the second horizontal direction Y over the substrate 110 and the plurality of direct contacts DC. The plurality of bit lines BL may be respectively connected to the plurality of first active areas AC1 through a corresponding direct contact DC. Each of the plurality of bit lines BL may include a lower conductive pattern 132A, a middle conductive pattern 134A, and an upper conductive pattern 136A, which are sequentially stacked on the substrate 110. The lower conductive pattern 132A may include doped polysilicon. The middle conductive pattern 134A and the upper conductive pattern 136A may each include TiN, TiSiN, W, tungsten silicide, or a combination thereof. In exemplary embodiments, the middle conductive pattern 134A may include TiN, TiSiN, or a combination thereof, and the upper conductive pattern 136A may include W.

The plurality of bit lines BL may be respectively covered with a plurality of insulation capping structures 140. Each of the plurality of insulation capping structures 140 may include a lower capping pattern 142A, an insulating layer pattern 144A, and an upper capping pattern 146A. The lower capping pattern 142A, the insulating layer pattern 144A, and the upper capping pattern 146A may each include a silicon nitride film. The plurality of insulation capping structures 140 may respectively extend in the second horizontal direction Y on the plurality of bit lines BL.

A spacer structure 150 may be arranged on both sidewalls of each of the plurality of bit lines BL. The spacer structure 150 may extend in the second horizontal direction Y on both sidewalls of each of the plurality of bit lines BL, and a portion of the spacer structure 150 may extend to an inner portion of the direct contact hole DCH and may cover both sidewalls of the direct contact DC.

In exemplary embodiments, the spacer structure 150 may include a first spacer layer 152, a second spacer layer 154, and a third spacer layer 156. The first spacer layer 152 may be conformally arranged on a sidewall of each of a plurality of bit lines BL, a sidewall of the insulation capping structure 140, and an inner wall of the direct contact hole DCH. The second spacer layer 154 and the third spacer layer 156 may be sequentially arranged on the first spacer layer 152. In some embodiments, the first and third spacer layers 152 and 156 may include silicon nitride, and the second spacer layer 154 may include silicon oxide. In some embodiments, the first and third spacer layers 152 and 156 may include silicon nitride, and the second spacer layer 154 may include air or a low-k dielectric material. As used herein, the term "air" may refer to a space including the atmosphere or any other gases that may be present during a manufacturing operation.

A buried insulating layer 158 may surround a lower sidewall of the direct contact DC on the first spacer layer 152 and may fill a remaining space of the direct contact hole DCH. The buried insulating layer 158 may include silicon nitride, silicon oxynitride, silicon oxide, or a combination thereof.

The direct contact DC may be formed in the direct contact hole DCH formed in the substrate 110, and may extend to a level higher than an upper surface of the substrate 110. For example, an upper surface of the direct contact DC may be at the same level as an upper surface of the lower conductive pattern 132A, and the upper surface of the direct contact DC may contact a bottom surface of the middle conductive pattern 134A. Also, a bottom surface of the direct contact DC may be at a level lower than the upper surface of the substrate 110.

A plurality of insulating fences 162 and a plurality of conductive plugs 166 may be arranged in a row in the second horizontal direction Y between each of the plurality of bit lines BL. The plurality of insulating fences 162 may be arranged on the capping insulation layer 126 arranged on the plurality of word line trenches 120T, respectively, and may have an upper surface arranged at the same level as an upper surface of the insulation capping structure 140. The plurality of conductive plugs 166 may extend long in a vertical direction (Z direction) from a recess space RS formed in the substrate 110. In the second horizontal direction Y, both sidewalls of each of the plurality of conductive plugs 166 may be insulated from each other by the plurality of insulating fences 162. The plurality of insulating fences 162 may each include a silicon nitride film. The plurality of conductive plugs 166 may configure the plurality of buried contacts BC illustrated in FIG. 1.

A top capping layer 164A may be arranged on the plurality of insulation capping structures 140, a plurality of spacer structures 150, and the plurality of insulating fences 162. For example, the top capping layer 164A may be arranged over an entire upper surface of the upper capping pattern 146A and an entire upper surface of an insulating fence 162. The top capping layer 164A may have a first thickness t11 in a direction perpendicular to the upper surface of the substrate 110. The first thickness t11 may be, but is not limited to be, from about 5 nm to about 100 nm. The top capping layer 164A may include a curved sidewall 164AS, and in a plan view, the curved sidewall 164AS may have a shape that partially surrounds a sidewall of the conductive plug 166. For example, the insulation capping structure 140, the spacer structure 150, the insulating fence 162, and the top capping layer 164A may act as an etching mask for etching a contact 162S in which the conductive plug 166 is to be formed therein.

In exemplary embodiments, the top capping layer 164A may include a material having an etch selectivity with respect to a material forming the insulation capping structure 140. For example, the top capping layer 164A may include a material having an etch selectivity with respect to a material included in the upper capping pattern 146A. In some embodiments, the upper capping pattern 146A may include a first insulating material, and the first insulating material may include silicon nitride. The top capping layer 164A may include a second insulating material, and the second insulating material may include a metal oxide such as titanium oxide.

In some embodiments, the top capping layer 164A may include a material having an etch selectivity with respect to a material forming the spacer structure 150 and/or the insulating fence 162. For example, the top capping layer 164A may include a material having an etch selectivity with respect to a material included in the third spacer layer 156 and/or the insulating fence 162. In some embodiments, the third spacer layer 156 may include the first insulating material, for example, silicon nitride, and the top capping layer 164A may include, for example, the second insulating material such as titanium oxide.

A plurality of metal silicide layers 168A and the plurality of landing pads LP may be formed on the plurality of conductive plugs 166. The plurality of metal silicide layers 168A and the plurality of landing pads LP may be arranged to vertically overlap the plurality of conductive plugs 166, respectively. The plurality of metal silicide layers 168A may each include cobalt silicide, nickel silicide, or manganese silicide. Each of the plurality of landing pads LP may be connected to the conductive plug 166 through the metal silicide layer 168A.

The plurality of landing pads LP may cover at least a portion of an upper surface of the top capping layer 164A and a sidewall of the insulation capping structure 140 to vertically overlap some of the plurality of bit lines BL. For example, the plurality of landing pads LP may be arranged to vertically overlap the top capping layer 164A, and may cover the curved sidewall 164AS of the top capping layer 164A.

Each of the plurality of landing pads LP may include a conductive barrier layer 172A and a landing pad conductive layer 174A. The conductive barrier layer 172A may include Ti, TiN, or a combination thereof. The landing pad conductive layer 174A may include a metal, a metal nitride, a conductive polysilicon, or a combination thereof. For example, the landing pad conductive layer 174A may include W. The plurality of landing pads LP may have a plurality of island-type pattern shapes when viewed in a plan view.

The plurality of landing pads LP may be electrically insulated from one another by an insulation pattern 180 disposed in an insulation space 180S around the plurality of landing pads LP. The insulation pattern 180 may fill the insulation space 180S arranged between the bit line BL and the conductive plug 166, and may cover both sidewalls of the insulation capping structure 140.

In some embodiments, the insulation pattern 180 may include silicon nitride, silicon oxynitride, silicon oxide, or a combination thereof. In some embodiments, the insulation pattern 180 may be formed to have a double-layer structure of a first material layer (not shown) and a second material layer (not shown), wherein the first material layer may include a low-k material such as $SiO_2$, SiOCH, and SiOC, and the second material layer may include silicon nitride or silicon oxynitride.

A peripheral circuit gate structure PGT may be formed on the second active area AC2 in the peripheral circuit area PCA. The peripheral circuit gate structure PGT may include a gate dielectric layer 116, a peripheral circuit gate electrode PG, and a gate capping pattern 142B, which are sequentially stacked on the second active area AC2.

The gate dielectric layer 116 may include at least one selected from a silicon oxide film, a silicon nitride film, a silicon oxynitride film, an ONO film, and a high-k dielectric film having a higher dielectric constant than that of the silicon oxide film. The peripheral circuit gate electrode PG may include a lower conductive pattern 132B, a middle conductive pattern 134B, and an upper conductive pattern 136B. The material of each of the lower conductive pattern 132B, the middle conductive pattern 134B, and the upper conductive pattern 136B may be the same as the materials of the lower conductive pattern 132A, the middle conductive pattern 134A, and the upper conductive pattern 136A, which are included in the bit line BL in the cell array area MCA. The gate capping pattern 142B may include a silicon nitride film.

Both sidewalls of the peripheral circuit gate structure PGT may be covered with an insulation spacer PGS. The insulation spacer PGS may include an oxide film, a nitride film, or a combination thereof. The peripheral circuit gate structure PGT and the insulation spacer PGS may be covered with a protective layer 144B. The protective layer 144B may include a silicon nitride film. An interlayer insulation layer 149 may be formed around the peripheral circuit gate structure PGT, on the protective layer 144B. The interlayer insulation layer 149 may include Tonen SilaZene (TOSZ), but is not limited thereto. The peripheral circuit gate structure PGT, the protective layer 144B, and the interlayer insulation layer 149 may be covered with an upper insulation capping layer 146B. The upper insulation capping layer 146B may include a silicon nitride film.

A top protective layer 164B may be disposed on the upper insulation capping layer 146B. The top protective layer 164B may have a flat upper surface to entirely cover the peripheral circuit gate structure PGT and may extend in the first horizontal direction X and the second horizontal direction Y.

The top protective layer 164B may include a material having an etch selectivity with respect to a material forming the upper insulation capping layer 146B. For example, the top protective layer 164B may have a material having an etch selectivity with respect to a material included in the upper capping pattern 146A. In some embodiments, the upper insulation capping layer 146B may include the first insulating material, and the first insulating material may include silicon nitride. The top protective layer 164B may include a second insulating material, and the second insulating material may include a metal oxide such as titanium oxide.

In exemplary embodiments, the top protective layer 164B may be simultaneously formed in an operation of forming the top capping layer 164A in the cell array area MCA, and the upper insulation capping layer 146B may be simultaneously formed in an operation of forming the upper capping pattern 146A in the cell array area MCA. However, the inventive concept is not limited thereto. For example, the top protective layer 164B may have a second thickness t12 in a direction perpendicular to the upper surface of the substrate 110. The second thickness t12 may be, but is not limited to be, from about 5 nm to about 10 nm.

A contact plug CP, vertically passing through the top protective layer 164B, the upper insulation capping layer 146B, the interlayer insulation layer 149, and the protective layer 144B and extending to the second active area AC2 of the substrate 110, may be formed in the peripheral circuit area PCA. The contact plug CP may include a conductive barrier layer 172B and a landing pad conductive layer 174B, similar to the plurality of landing pads LP formed in the cell array area MCA. A metal silicide layer 168B may be arranged between the second active area AC2 and the contact plug CP. The metal silicide layer 168B may include cobalt silicide, nickel silicide, or manganese silicide.

In general, a recess space is formed by removing an upper side of a substrate between two insulation capping structures and between two insulating fences, and a conductive plug filling the recess space is formed. However, as the degree of integration of an integrated circuit device increases, a width of the recess space decreases and a height of the insulation capping structure increases, thereby significantly increasing the difficulty of an etching operation and making a precise adjustment on the etching operation difficult.

However, in exemplary embodiments, the top capping layer 164A including the second insulating material may be arranged on the insulation capping structure 150 and the insulating fence 162 each including the first insulating material, and the top capping layer 164A may include a metal oxide having an etch selectivity with respect to the insulation capping structure 150 and the insulating fence 162. As the top capping layer 164A is etched relatively less in the etching operation, a vertical height of a stack structure including the insulation capping structure 150 and the insulating fence 162 may be reduced, and an aspect ratio of the recess space may be increased, thereby performing a precise adjustment of the etching operation.

FIGS. 5A to 19B are cross-sectional views sequentially showing operations of a method of manufacturing an integrated circuit device according to exemplary embodiments. In particular, FIGS. 5A, 6A, 7A, 8A, 9A, 10 to 13, 14A, 15A, 16, 17A, 18A, and 19A are cross-sectional views corresponding to cross-sections taken along lines A1-A1' and A2-A2' shown in FIG. 1, and FIGS. 5B, 6B, 7B, 8B, 9B, 14B, 15B, 17B, 18B, and 19B are cross-sectional views corresponding to a cross-section taken along line B-B' shown in FIG. 1. A method of manufacturing the integrated circuit device 100 illustrated in FIGS. 1 to 4 will be described below with reference to FIGS. 5A to 19B.

Figure 5A:
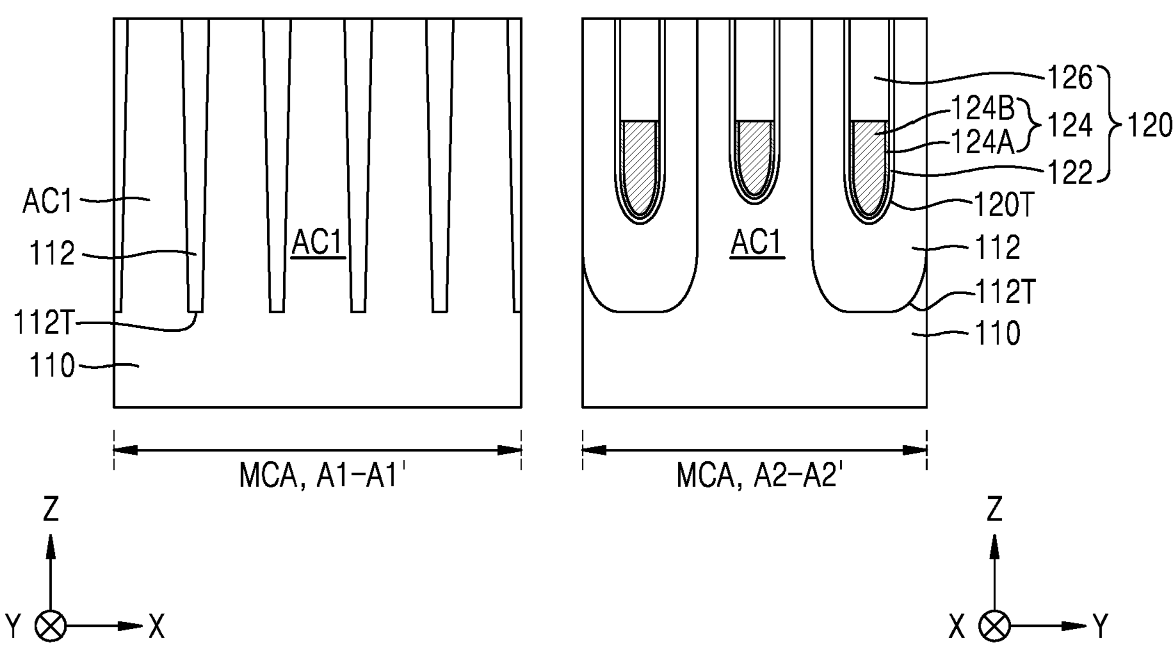
Figure 5B:
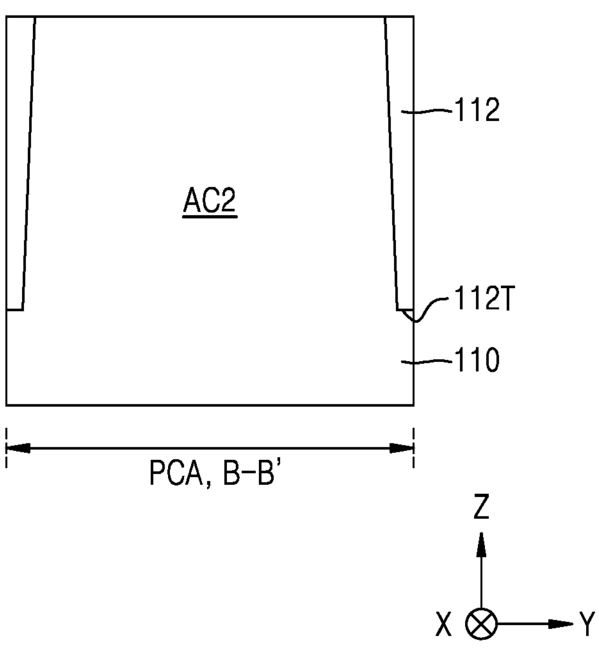

Referring to FIGS. 5A and 5B, by forming a plurality of device isolation trenches 112T and a plurality of device isolation layers 112 in the substrate 110 which includes the cell array area MCA and the peripheral circuit area PCA, the plurality of first active areas AC1 may be defined in the cell array area MCA of the substrate 110, and the second active area AC2 may be defined in the peripheral circuit area PCA.

The plurality of word line trenches 120T extending in parallel with one another may be formed in the substrate 110 in the cell array area MCA. After cleaning out a resultant material in which the plurality of word line trenches 120T are formed, in the plurality of word line trenches 120T, a plurality of gate dielectric layers 122, a plurality of gate electrodes 124, and a plurality of capping insulation layers 126 may be sequentially formed. A plurality of source/drain areas (not shown) may be respectively formed on the plurality of first active areas AC1 by implanting impurity ions into both side portions of the plurality of gate electrodes 124 in the plurality of first active areas AC1.

The plurality of gate electrodes 124 may each include the work function adjustment layer 124A and the buried conductive layer 124B arranged on an inner wall of each of the plurality of word line trenches 120T. For example, the plurality of gate electrodes 124 may be formed by sequentially forming the work function adjustment layer 124A and the buried conductive layer 124B on the inner wall of each of the plurality of word line trenches 120T and removing portions of the work function adjustment layer 124A and the buried conductive layer 124B arranged on the inner wall of each of the word line trenches 120T by an etch-back operation.

Figure 6A:
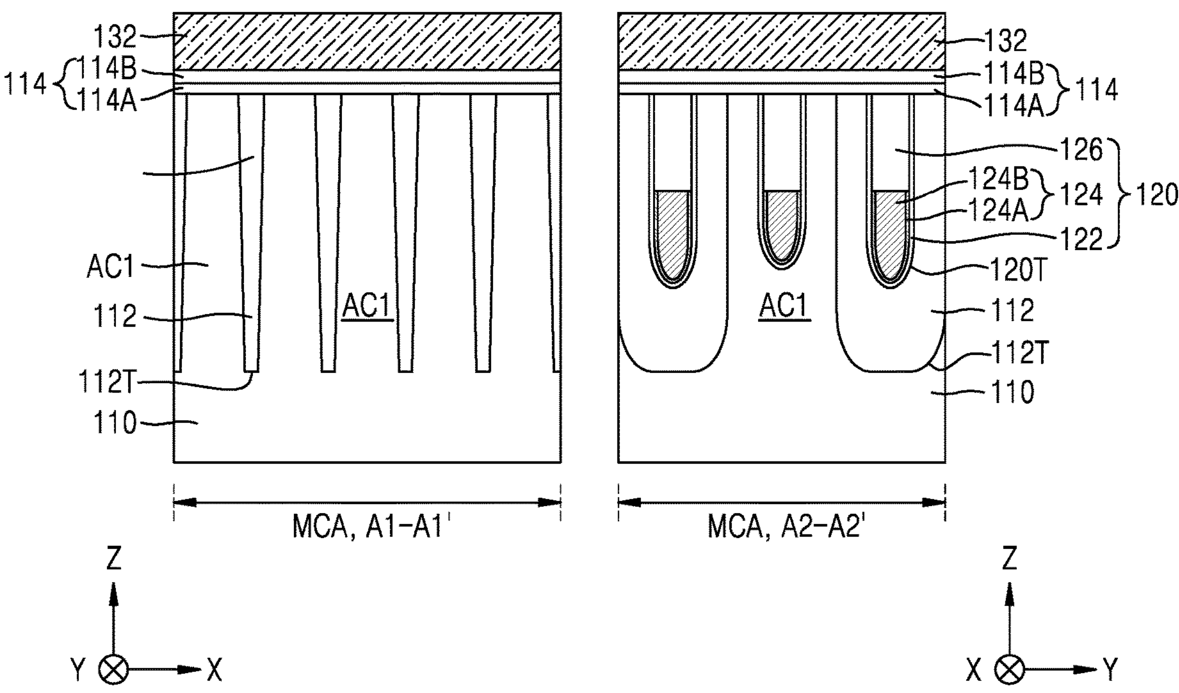
Figure 6B:
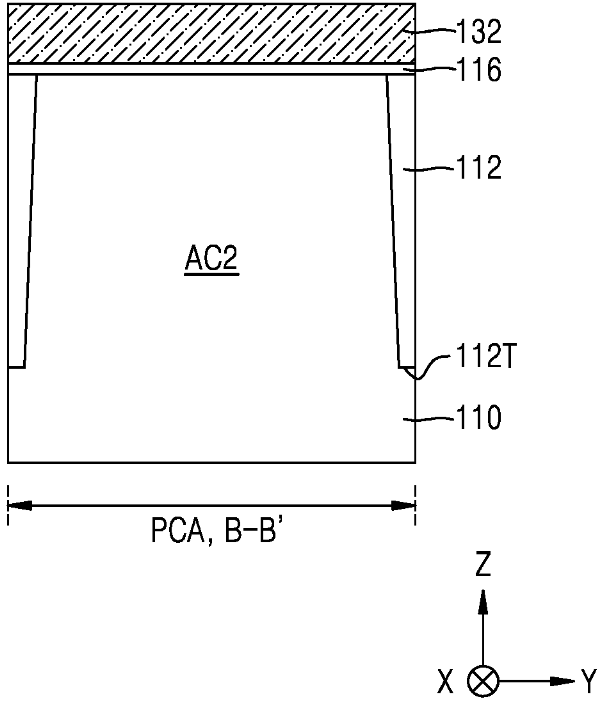

Referring to FIGS. 6A and 6B, the buffer layer 114 including the first insulating layer 114A and the second insulating layer 114B may be formed on the substrate 110 in the cell array area MCA, and the gate dielectric layer 116 may be formed on the substrate 110 in the peripheral circuit area PCA.

Subsequently, a lower conductive layer 132 may be formed on the buffer layer 114 of the cell array area MCA and the gate dielectric layer 116 of the peripheral circuit area PCA. In exemplary embodiments, the lower conductive layer 132 may include silicon (Si), Ge, W, WN, cobalt (Co), nickel (Ni), aluminum (Al), molybdenum (Mo), ruthenium (Ru), Ti, TiN, Ta, TaN, copper (Cu), or a combination thereof. For example, the lower conductive layer 132 may include polysilicon.

Figure 7A:
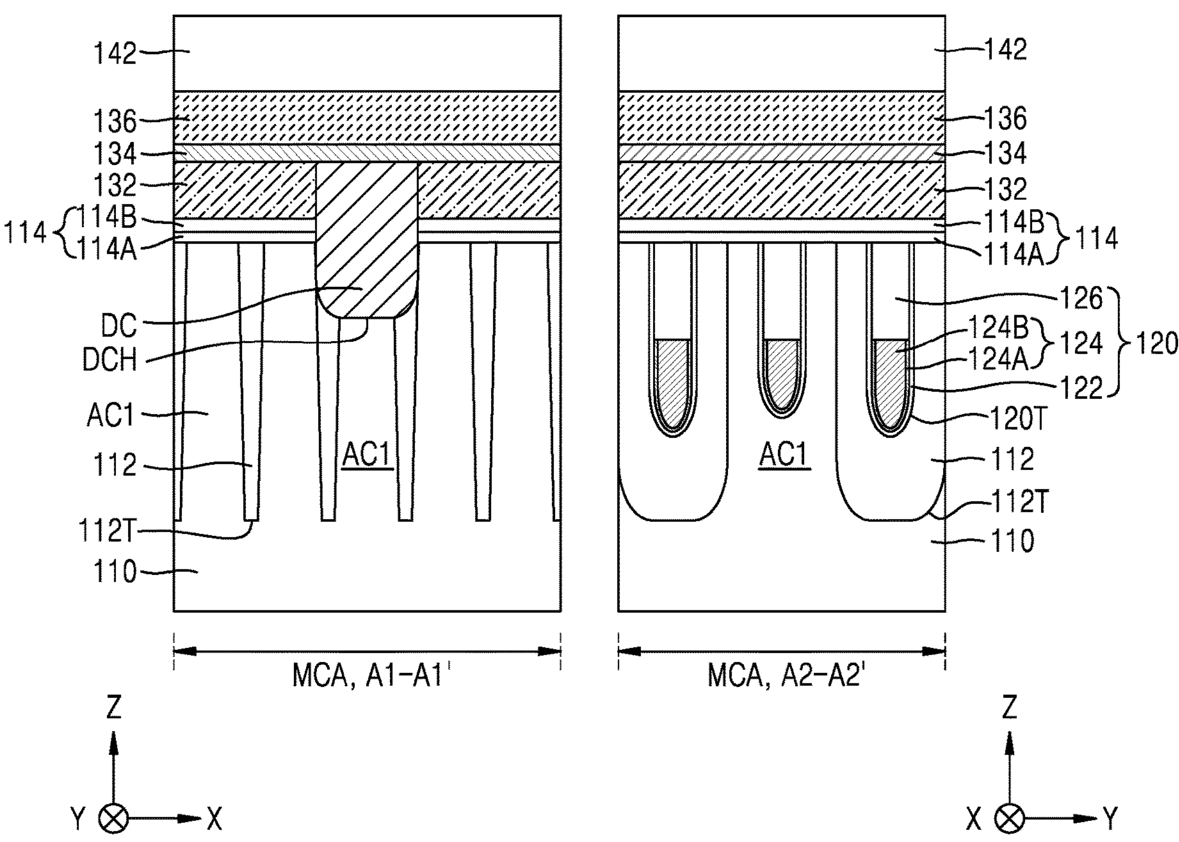
Figure 7B:
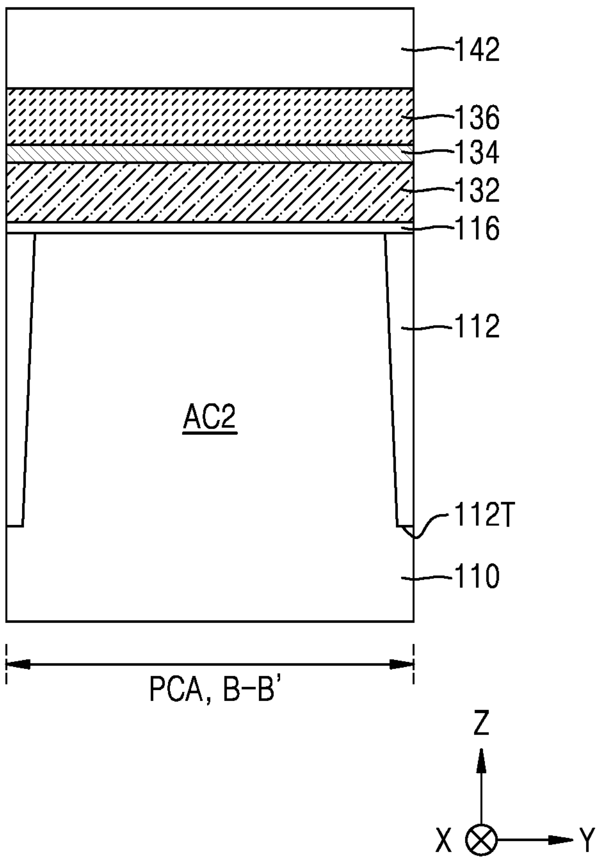

Referring to FIGS. 7A and 7B, a first mask pattern (not shown) may be formed on the lower conductive layer 132, the lower conductive layer 132 exposed through an opening (not shown) of the first mask pattern may be etched in the cell array area MCA, subsequently, a direct contact hole DCH exposing the first active area AC1 of the substrate 110 may be formed by etching a portion of the substrate 110 and a portion of the device isolation layer 112 each exposed by the etching.

Subsequently, the first mask pattern may be removed, and the direct contact DC may be formed in the direct contact hole DCH. In an exemplary operation of forming the direct contact DC, a conductive layer having a thickness sufficient to fill the direct contact hole DCH may be formed inside the direct contact hole DCH and on the lower conductive layer 132, and the conductive layer may be etched back to remain in only the direct contact hole DCH. The conductive layer may include polysilicon.

Then, in the cell array area MCA and the peripheral circuit area PCA, a middle conductive layer 134, an upper conductive layer 136, and a lower capping layer 142 may be sequentially formed on the lower conductive layer 132 and the direct contact DC. Each of the middle conductive layer 134 and the upper conductive layer 136 may include TiN, TiSiN, W, tungsten silicide, or a combination thereof. The lower capping layer 142 may include a silicon nitride film.

Figure 8A:
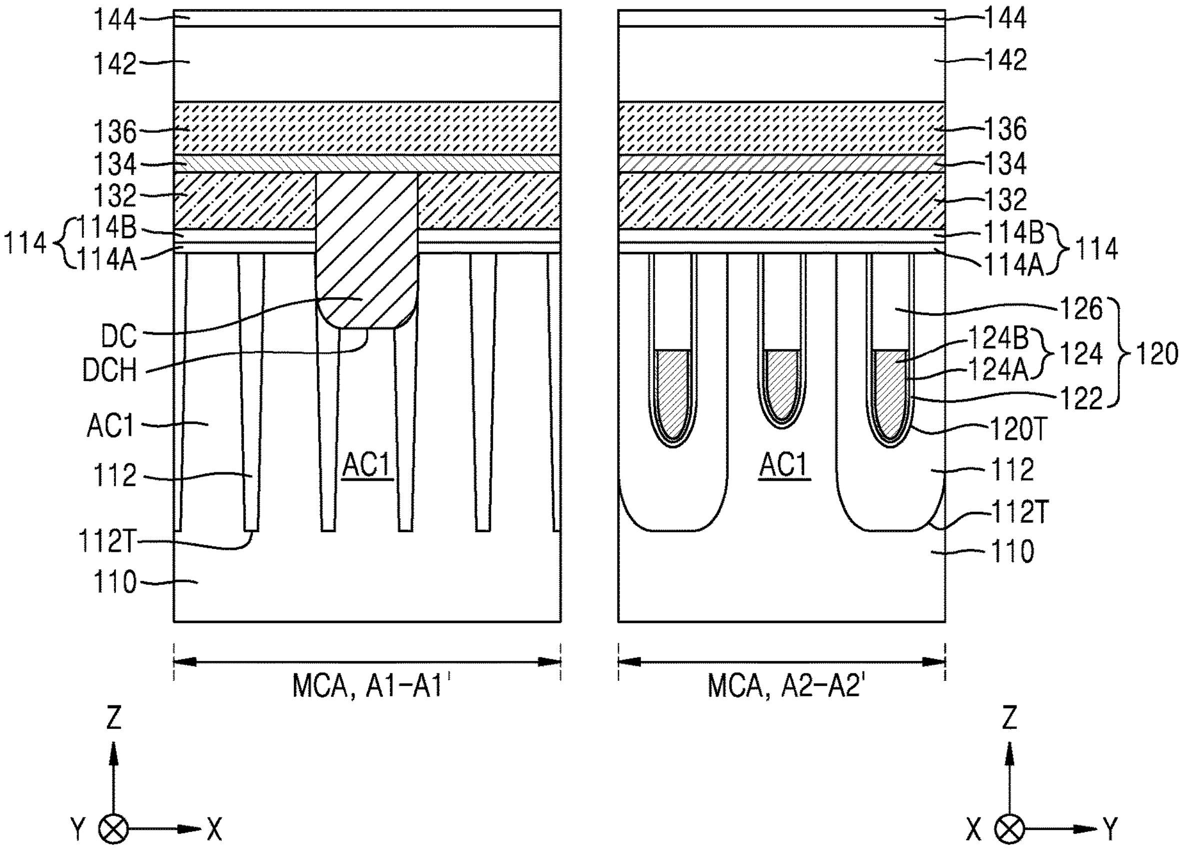
Figure 8B:
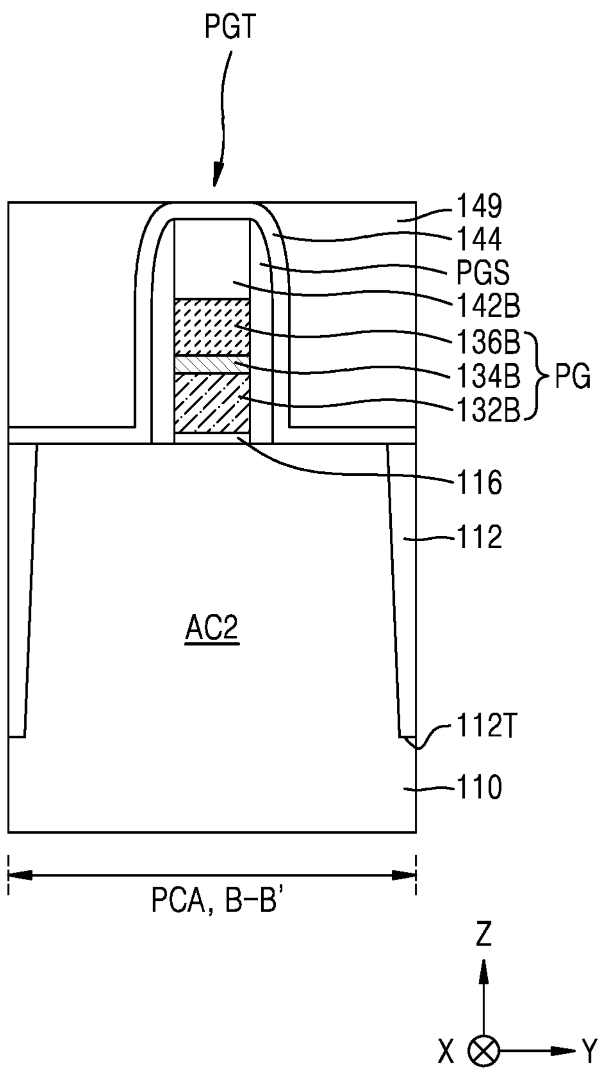

Referring to FIGS. 8A and 8B, which show the peripheral circuit area PCA in a state where a mask pattern (not shown) covers the cell array area MCA, the gate dielectric layer 116, the lower conductive layer 132, the middle conductive layer 134, the upper conductive layer 136, and the lower capping layer 142 are patterned to form the peripheral circuit gate electrode PG including the lower conductive pattern 132B, the middle conductive pattern 134B, and the upper conductive pattern 136B on the gate dielectric layer 116 and to form the gate capping pattern 142B covering the peripheral circuit gate electrode PG. Subsequently, the insulation spacer PGS may be formed on both sidewalls of the peripheral circuit gate structure PGT which is formed in a stack structure of the gate dielectric layer 116, the peripheral circuit gate electrode PG, and the gate capping pattern 142B, and an ion implantation operation for forming a source/drain area in the second active area AC2 may be performed at both sides of the peripheral circuit gate structure PGT.

Subsequently, the lower capping layer 142 may be exposed in the cell array area MCA by removing the mask pattern which has covered the cell array area MCA, an insulating layer 144 covering the lower capping layer 142 in the cell array area MCA and covering the peripheral circuit gate structure PGT and the insulation spacer PGS in the peripheral circuit area PCA may be formed. Subsequently, an interlayer insulation layer 149 filled into a space around the peripheral circuit gate structure PGT may be formed in the peripheral circuit area PCA.

Figure 9A:
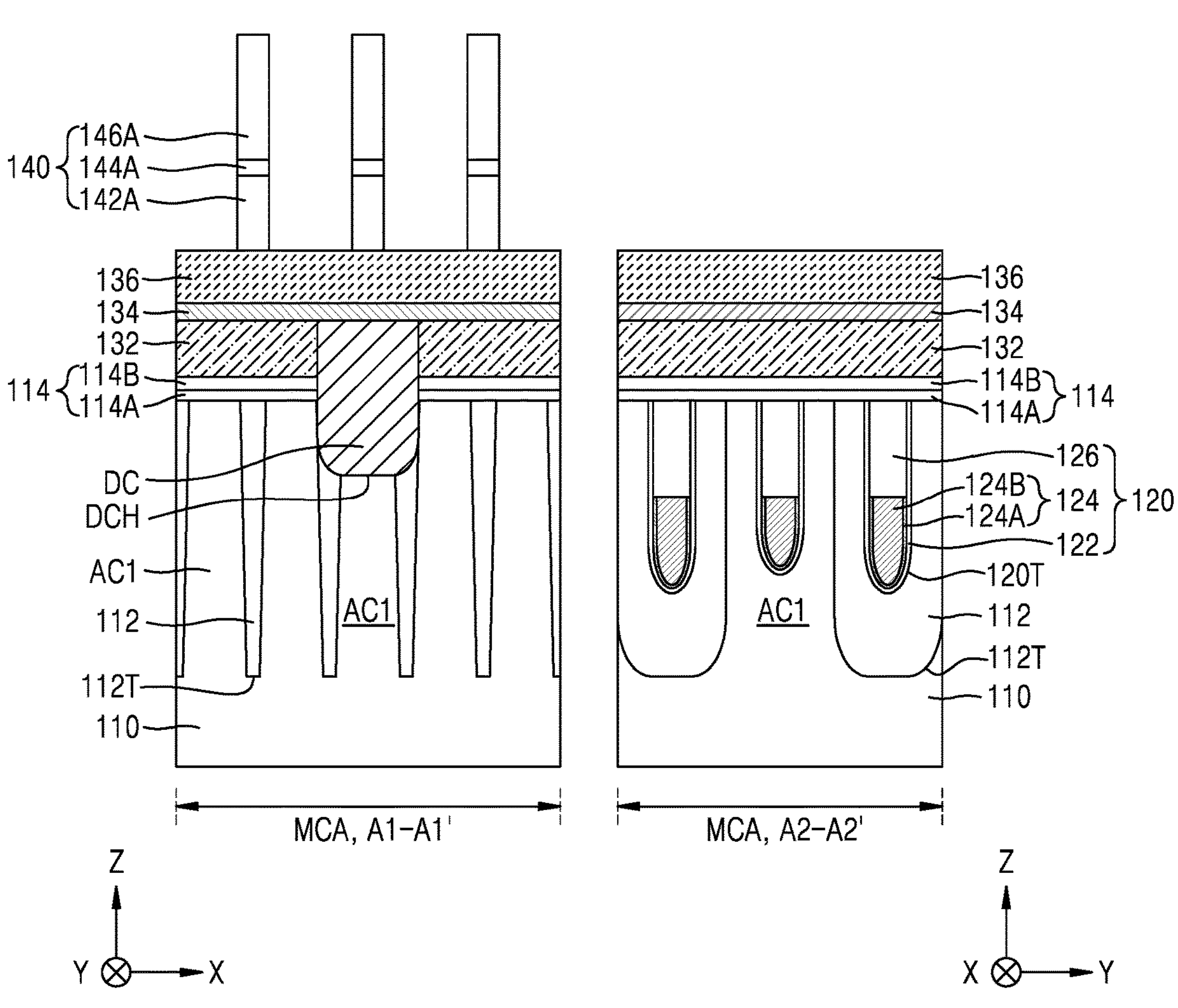
Figure 9B:
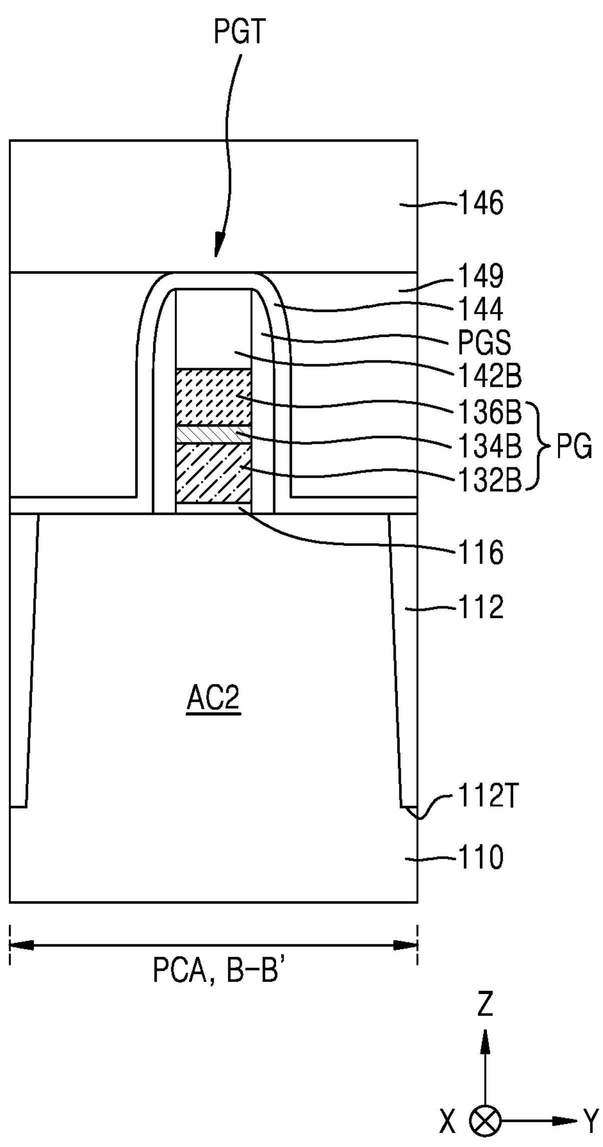

Referring to FIGS. 9A and 9B, an upper insulation capping layer 146 covering the insulating layer 144 and the interlayer insulation layer 149 in the peripheral circuit area PCA and covering the insulating layer 144 in the cell array area MCA is formed.

Subsequently, a mask pattern (not shown) is formed in the peripheral circuit area PCA, and the lower capping pattern 142A, the insulating layer pattern 144A, and the upper capping pattern 146A sequentially stacked on the upper conductive layer 136 are formed by patterning the upper insulation capping layer 146, the insulating layer 144, and the lower capping layer 142 in the cell array area MCA. Here, the lower capping pattern 142A, the insulating layer pattern 144A, and the upper capping pattern 146A may be referred to as an insulation capping structure 140.

Figure 10:
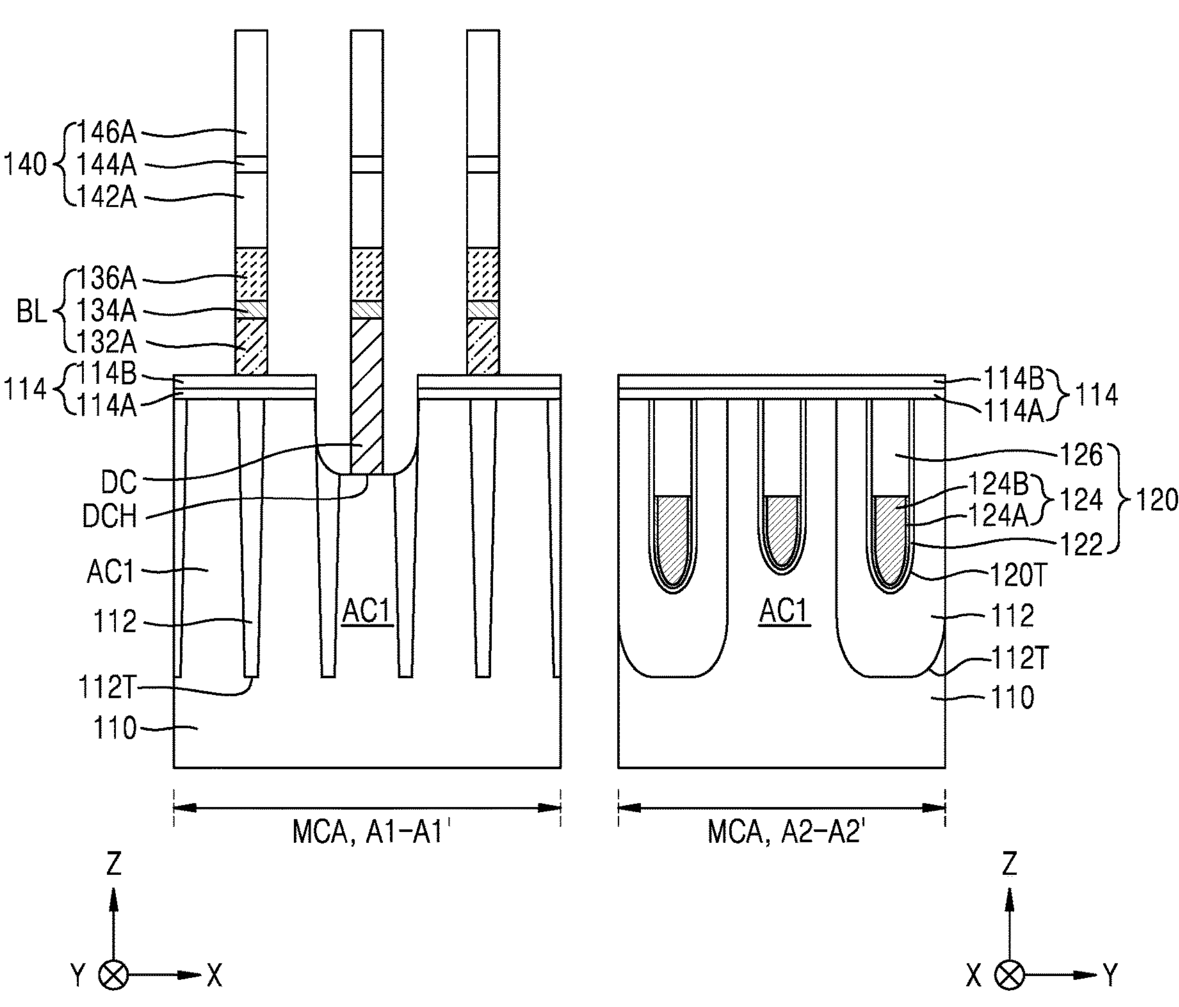

Referring to FIG. 10, the plurality of bit lines BL including the lower conductive pattern 132A, the middle conductive pattern 134A, and the upper conductive pattern 136A are formed by etching the upper conductive layer 136, the middle conductive layer 134, and the lower conductive layer 132 by using the lower capping pattern 142A, the insulating layer pattern 144A, and the upper capping pattern 146A as an etching mask, in the cell array area MCA.

In an operation of forming the plurality of bit lines BL, a portion of a sidewall of the direct contact DC may be removed, and a portion of the direct contact hole DCH may be exposed.

Figure 11:
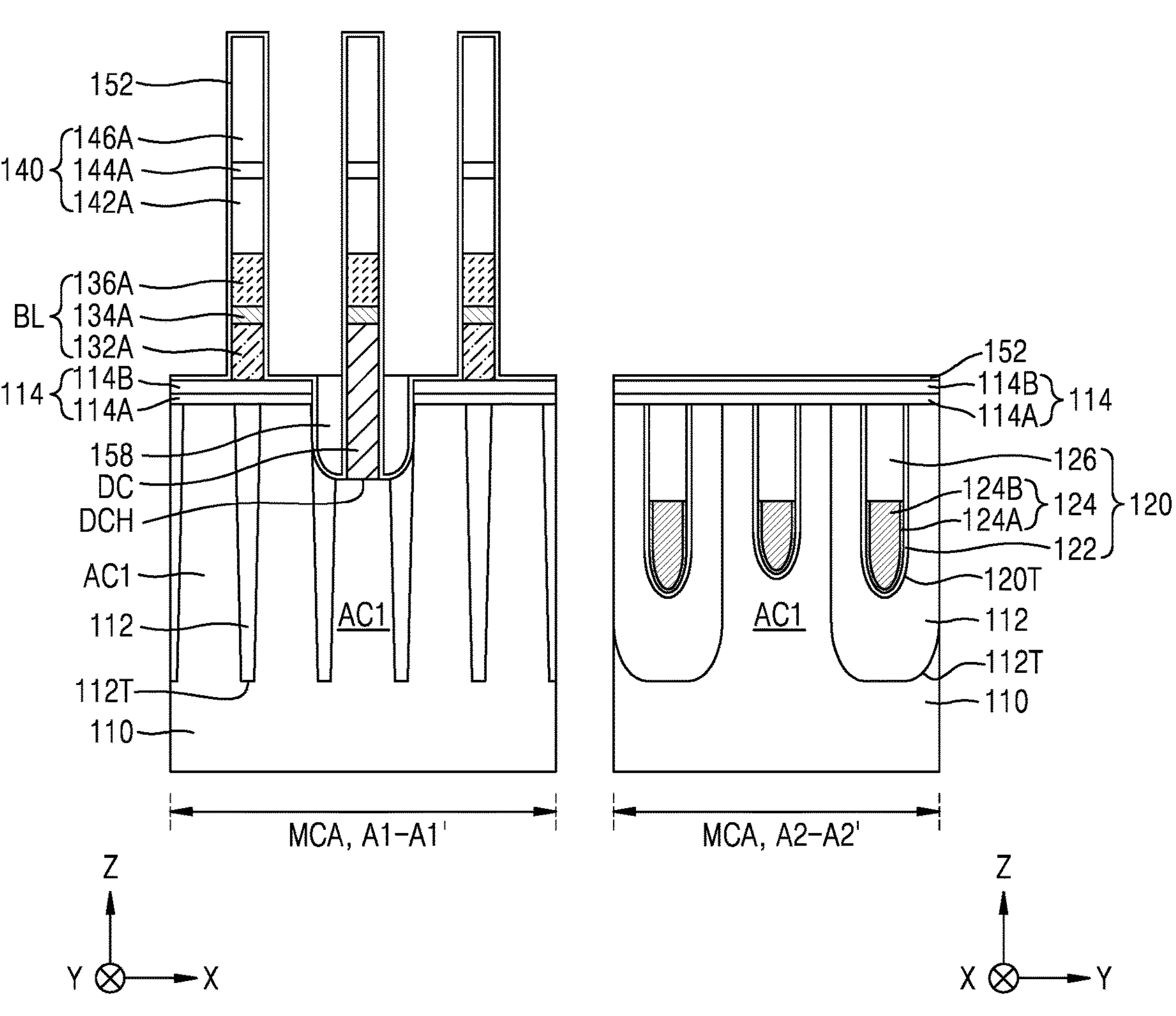

Referring to FIG. 11, the first spacer layer 152 may be formed on a sidewall of each of the plurality of bit lines BL and the sidewall of the direct contact DC. Subsequently, an insulating layer (not shown) having a thickness sufficient to fill the inside of the direct contact hole DCH may be formed on the sidewalls of the plurality of bit lines BL and the sidewall of the direct contact DC, and then, anisotropic etching may be performed on the insulating layer to leave the buried insulating layer 158 filling the inside of the direct contact hole DCH.

Figure 12:
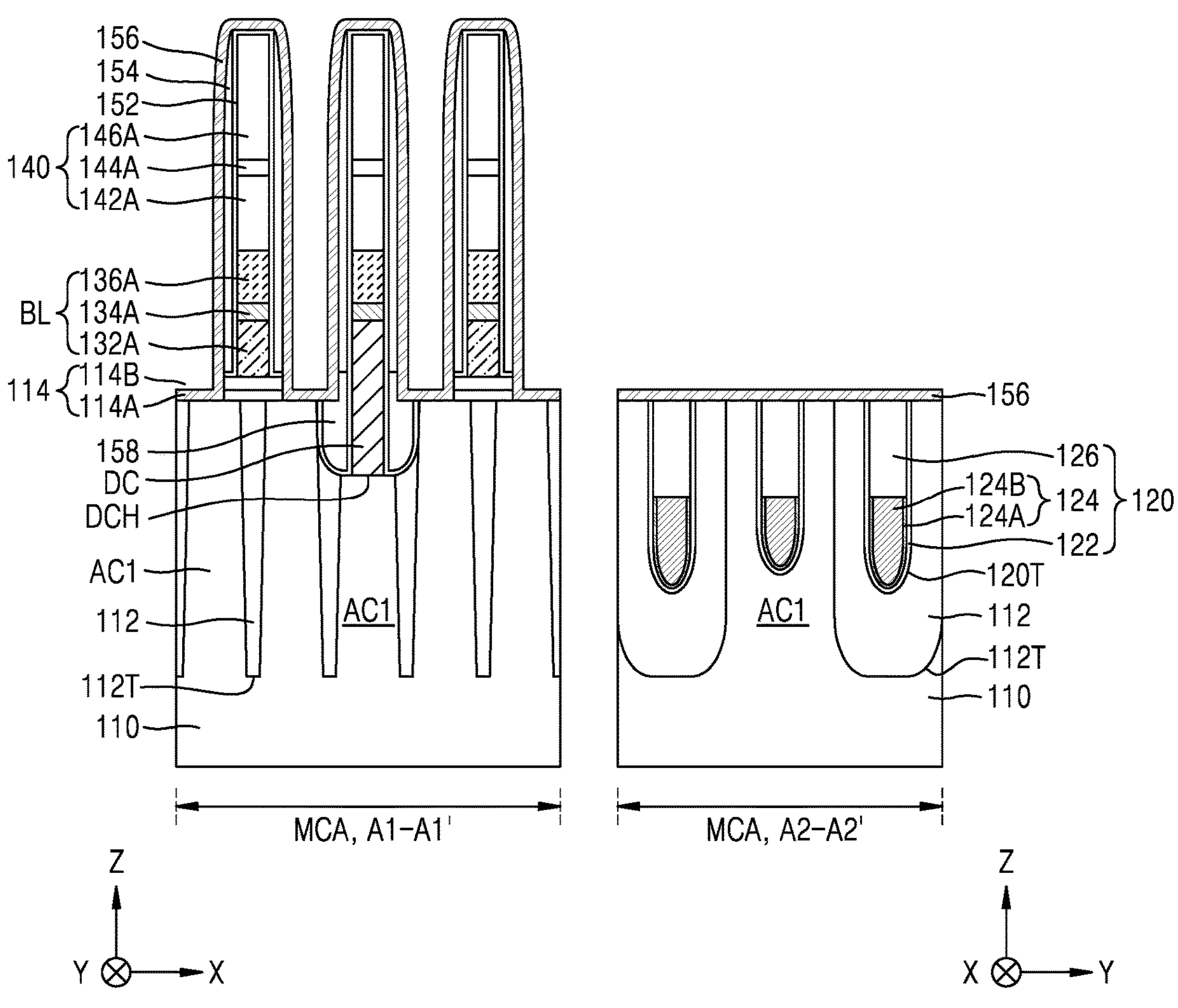

Referring to FIG. 12, the second spacer layer 154 covering the first spacer layer 152 may be formed on the sidewalls of the plurality of bit lines BL. By using the second spacer layer 154 as an etch mask, a portion of the buffer layer 114 arranged between the plurality of bit lines BL may be removed, and the upper surface of the substrate 110 may be exposed. At this time, a portion of the buried insulating layer 158 may also be removed.

Subsequently, the third spacer layer 156 may be formed on the sidewalls of the plurality of bit lines BL and the upper surface of the substrate 110.

Figure 13:
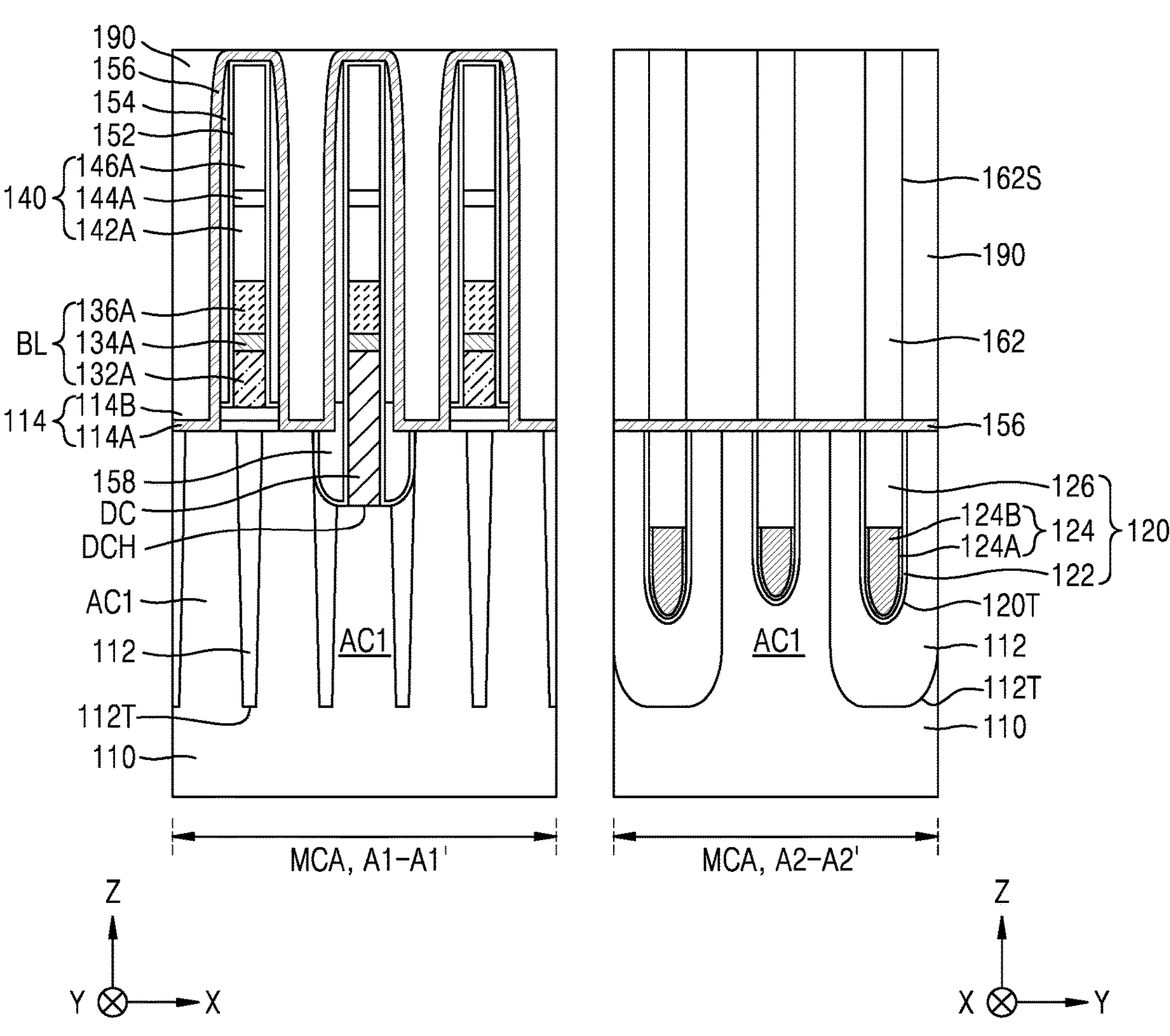

Referring to FIG. 13, the plurality of insulating fences 162 may be formed between two adjacent bit lines BL of the plurality of bit lines BL in the cell array area MCA. For example, the plurality of insulating fences 162 may be formed to vertically overlap the plurality of word line trenches 120T, respectively, and upper surfaces of the plurality of insulating fences 162 may be arranged at the same level as an upper surface of the third spacer layer 156.

The plurality of insulating fences 162 may be arranged to be spaced apart from one another in the second horizontal direction Y, and accordingly, a contact space 162S may be defined between two adjacent insulating fences 162 among the plurality of insulating fences 162 and between two bit lines BL.

Thereafter, a buried layer 190 may be formed in the contact space 162S by filling the contact space 162S between the insulating fences 162 with an insulating material and planarizing an upper portion of the insulating material. For example, the buried layer 190 may be formed by using silicon oxide.

Figure 14A:
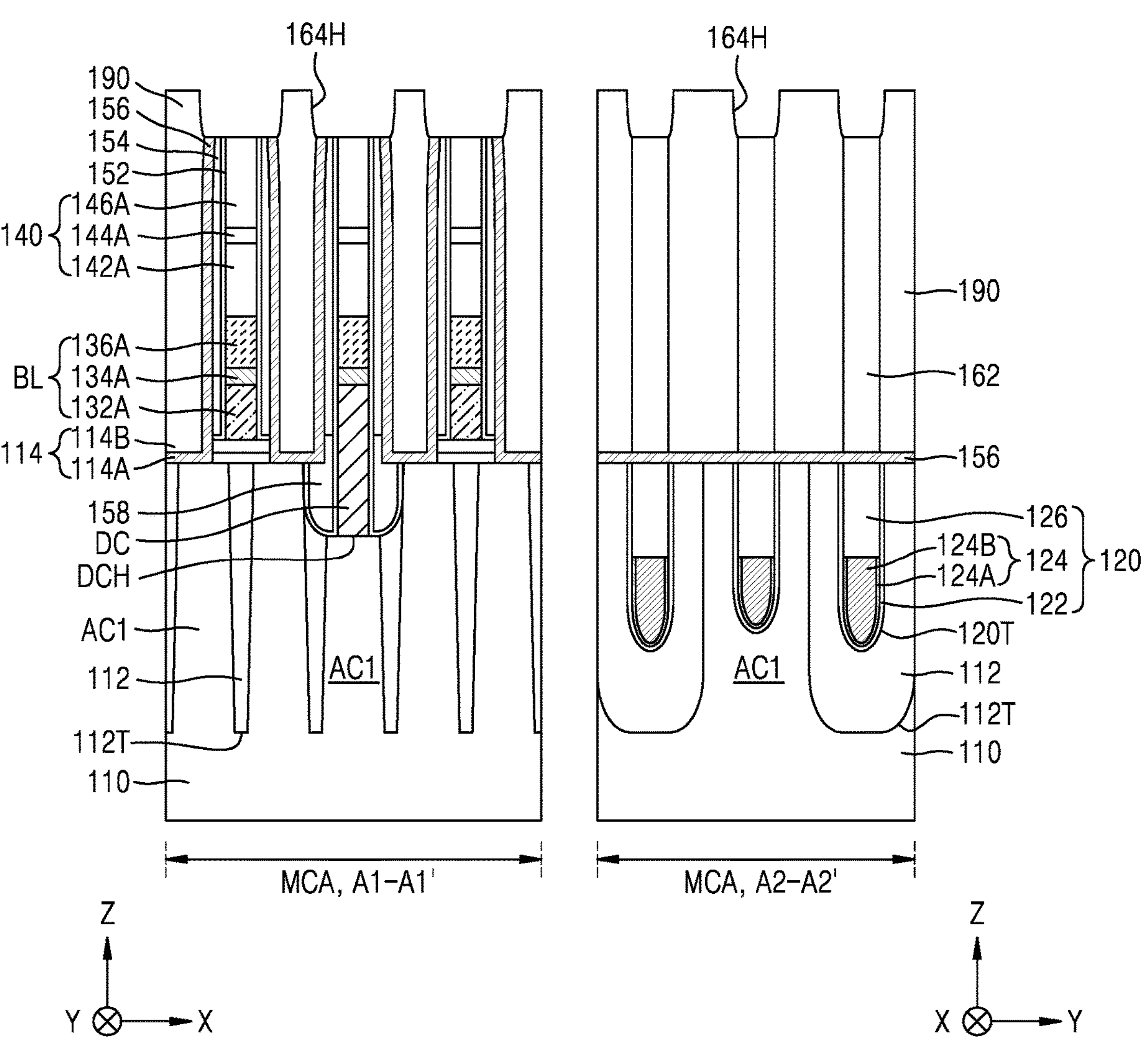
Figure 14B:
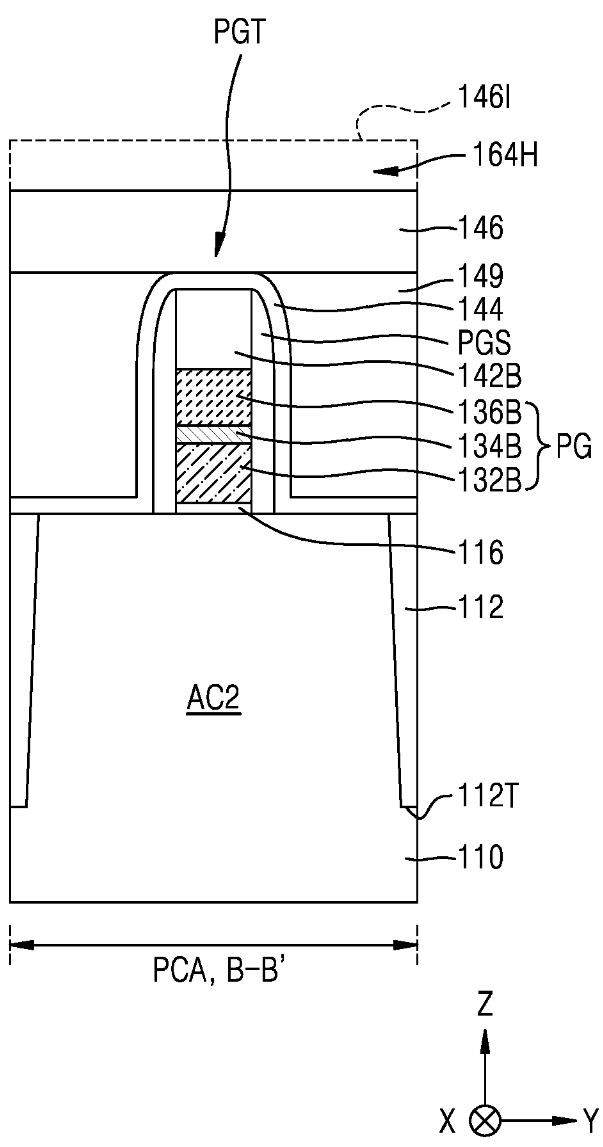

Referring to FIGS. 14A and 14B, a top opening portion 164H may be formed by removing an upper portion of each of the insulation capping structures 140, the third spacer layer 156, and the insulating fence 162 from the cell array area MCA and removing a portion of the upper insulation capping layer 146 from the peripheral circuit area PCA. The removal operation may be an etching operation using etch selectivity. For example, the removal operation may be an operation using an etching atmosphere in which the insulation capping structure 140, the third spacer layer 156, the insulating fence 162, and the upper insulation capping layer 146 are removed at a relatively high rate while the buried layer 190 is hardly removed. In some exemplary embodiments, the removal operation may be a wet etching operation using phosphoric acid, but is not limited thereto.

In FIG. 14B, for convenience of description, an upper surface 1461 of the upper insulation capping layer 146 before the etching operation is performed is shown in a dashed line. For example, because the upper insulation capping layer 146 has a flat upper surface level in the peripheral circuit area PCA, the upper insulation capping layer 146 may also formed to have a flat upper surface level even after the etching operation. In addition, a thickness at which the insulation capping structure 140, the third spacer layer 156, and the insulating fence 162 are removed from the cell array area MCA may be substantially the same as a thickness at which the upper insulation capping layer 146 is removed from the peripheral circuit area PCA.

Figure 15A:
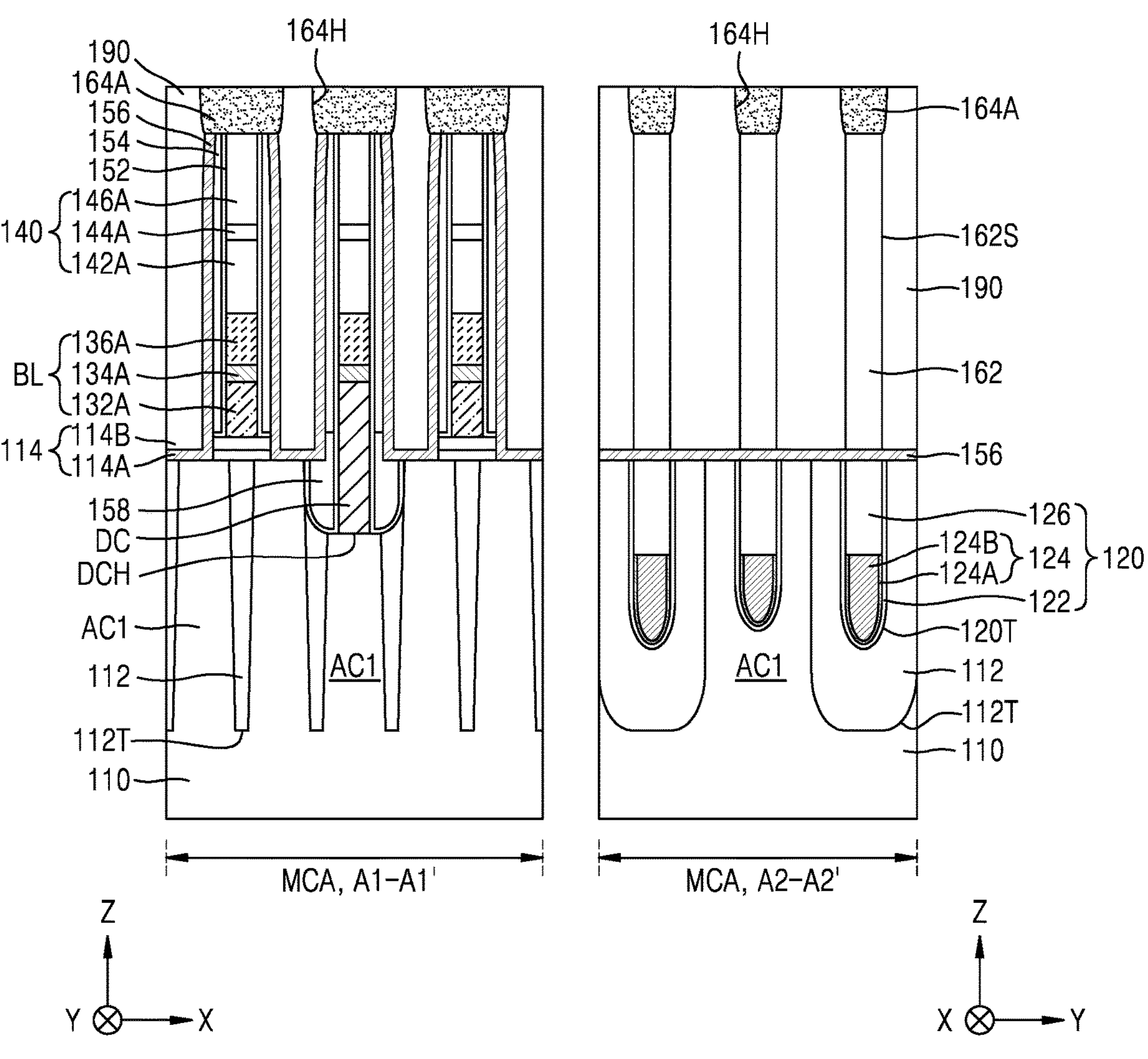
Figure 15B:
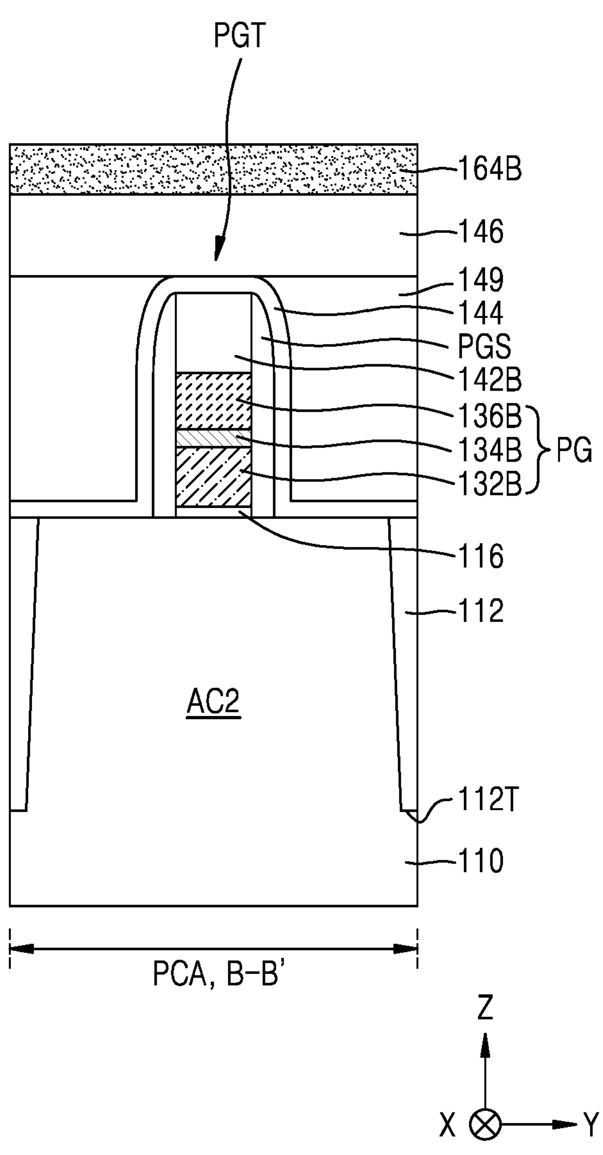

Referring to FIGS. 15A and 15B, the top capping layer 164A filling the top opening portion 164H may be formed on the insulation capping structure 140, the third spacer layer 156, and the insulating fence 162 in the cell array area MCA, and the top protective layer 164B filling the top opening portion 164H may be formed on the upper insulation capping layer 146 in the peripheral circuit area PCA.

The top capping layer 164A and the top protective layer 164B may be formed by using a material having an etch selectivity with respect to the insulation capping structure 140, the third spacer layer 156, the insulating fence 162, and the upper insulation capping layer 146. For example, the top capping layer 164A and the top protective layer 164B may be formed by using titanium oxide. However, the inventive concept is not limited thereto.

In exemplary embodiments, in a plan view, the buried layer 190 may have an island shape, and the top capping layer 164A may have a grid or mesh shape surrounding the buried layer 190 having the island shape.

Figure 16:
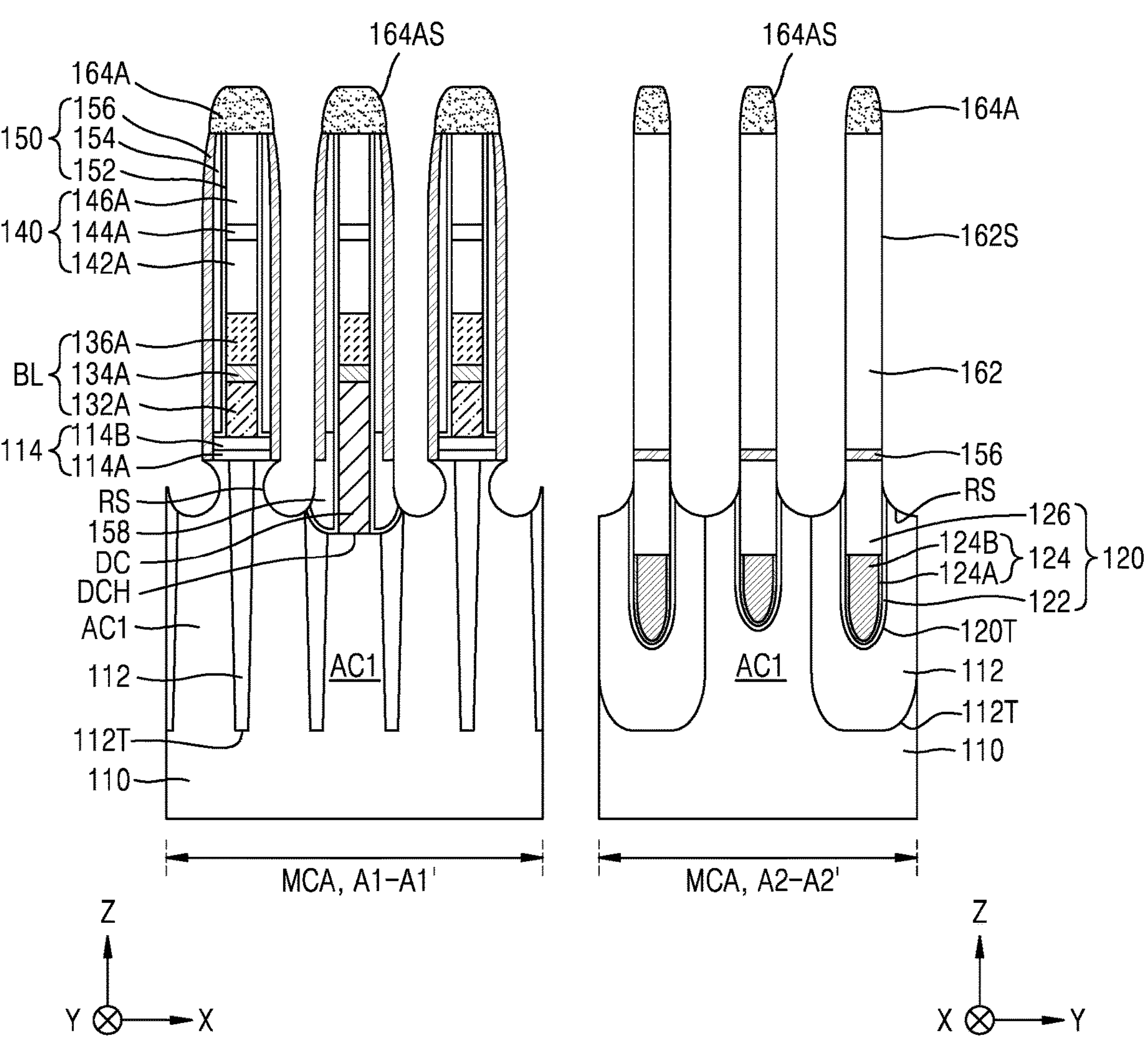

Referring to FIG. 16, the buried layer 190 may be removed to expose a plurality of contact spaces 162S again, and the buffer layer 114 and a portion of the substrate 110 which are arranged on the bottom of the plurality of contact spaces 162S are removed to form a plurality of recess spaces RS exposing the first active area AC1 of the substrate 110 between two adjacent bit lines BL of the plurality of bit lines BL.

In an etching operation for forming the recess space RS, a relatively small amount of the top capping layer 164A may be removed, and the spacer structure 150 arranged below the top capping layer 164A may also be etched in a relatively small amount. As an upper side of the top capping layer 164A is removed in the etching operation, the top capping layer 164A may have a curved sidewall 164AS. Because the curved sidewall 164AS of the top capping layer 164A was generated by removing a side portion of the top capping layer 164A in the etching operation of forming the recess space RS, the curved sidewall 164AS may have a shape surrounding the recessed space RS.

Figure 17A:
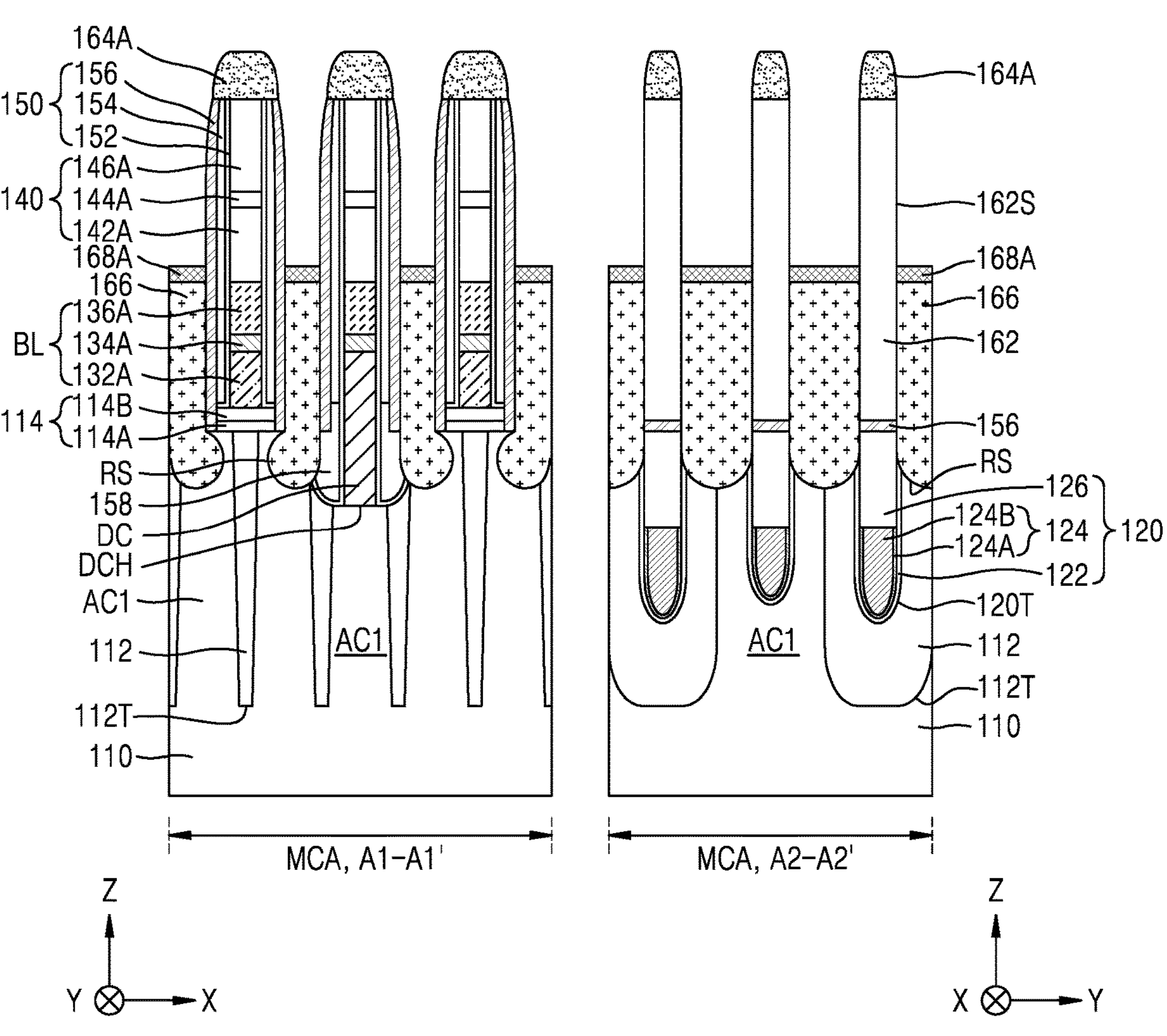
Figure 17B:
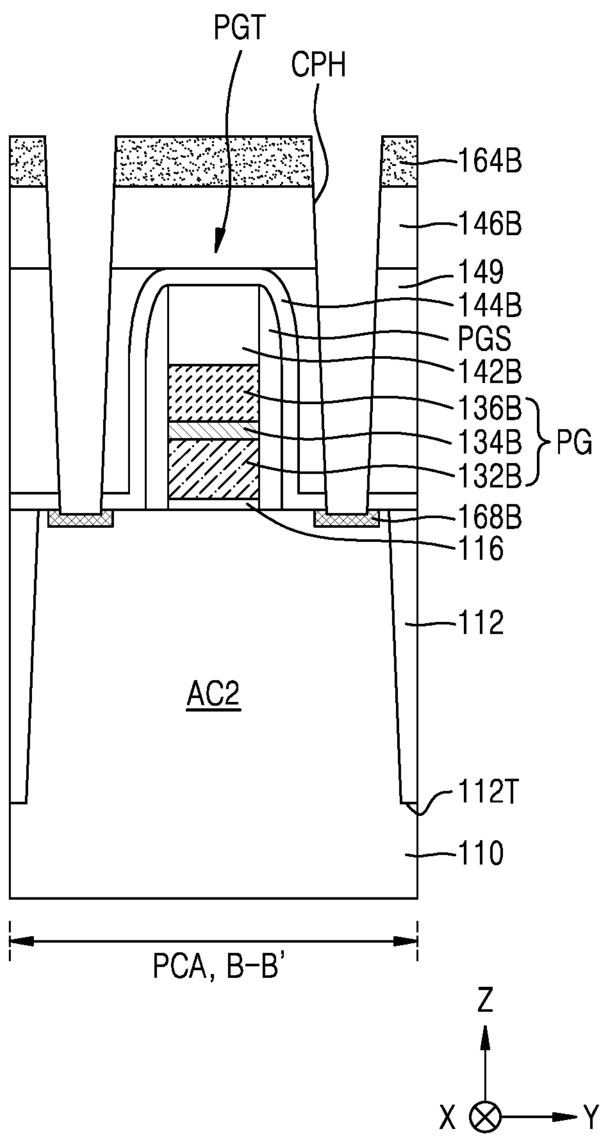

Referring to FIGS. 17A and 17B, the plurality of conductive plugs 166, which are respectively filled into the plurality of recess spaces RS and are each filled into a portion of the contact space 162S between two adjacent bit lines BL of the plurality of bit lines BL, may respectively be formed between the plurality of bit lines BL in the cell array area MCA.

Subsequently, in the peripheral circuit area PCA, by etching the upper insulation capping layer 146B, the interlayer insulation layer 149, and the protective layer 144B, a plurality of contact holes CPH exposing the second active area AC2 of the substrate 110 are formed.

Then, a metal silicide layer 168A may be formed on the conductive plug 166 exposed through the plurality of contact spaces 162S in the cell array area MCA, and the metal silicide layer 168B may be formed on a surface of the second active area AC2 exposed through the plurality of contact holes CPH in the peripheral circuit area PCA. The metal silicide layers 168A and 168B may be formed simultaneously, or may be formed by separate operations.

Figure 18A:
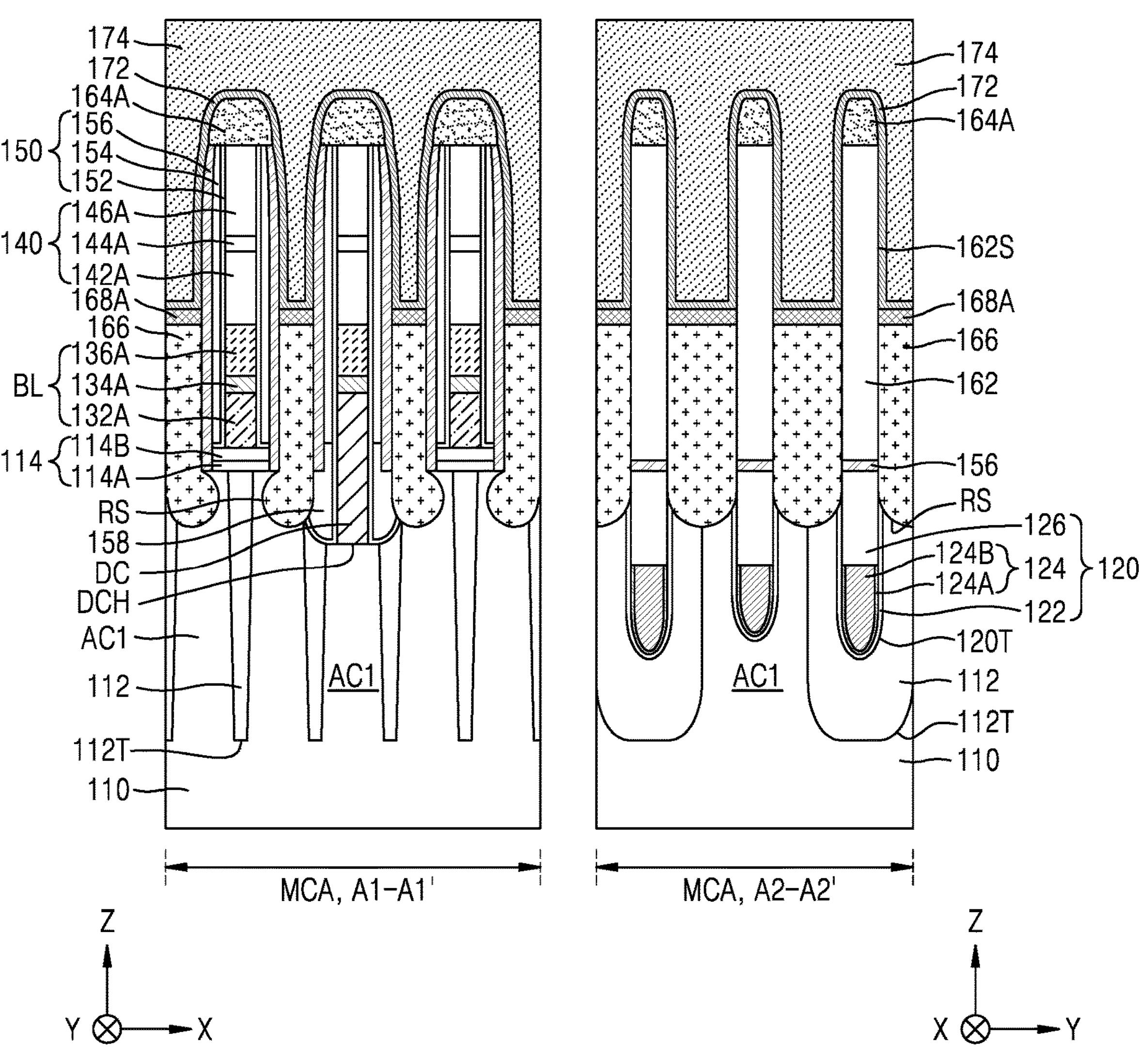
Figure 18B:
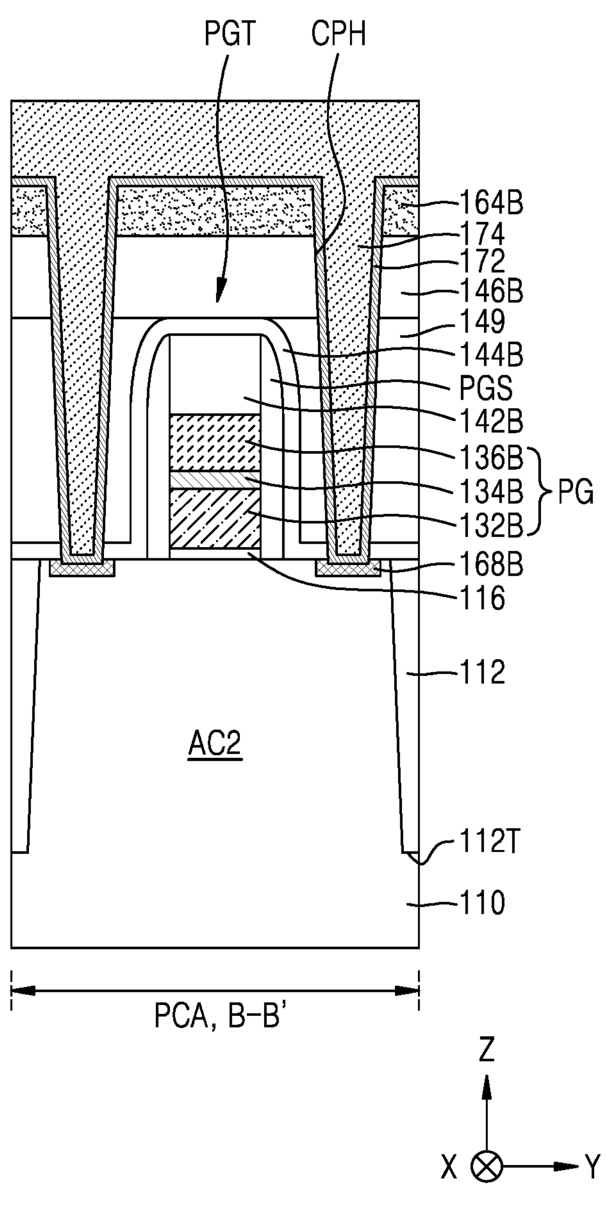

Referring to FIGS. 18A and 18B, a conductive barrier layer 172 and a conductive layer 174 each covering an exposed surface may be formed on the substrate 110 in the cell array area MCA and the peripheral circuit area PCA.

Figure 19A:
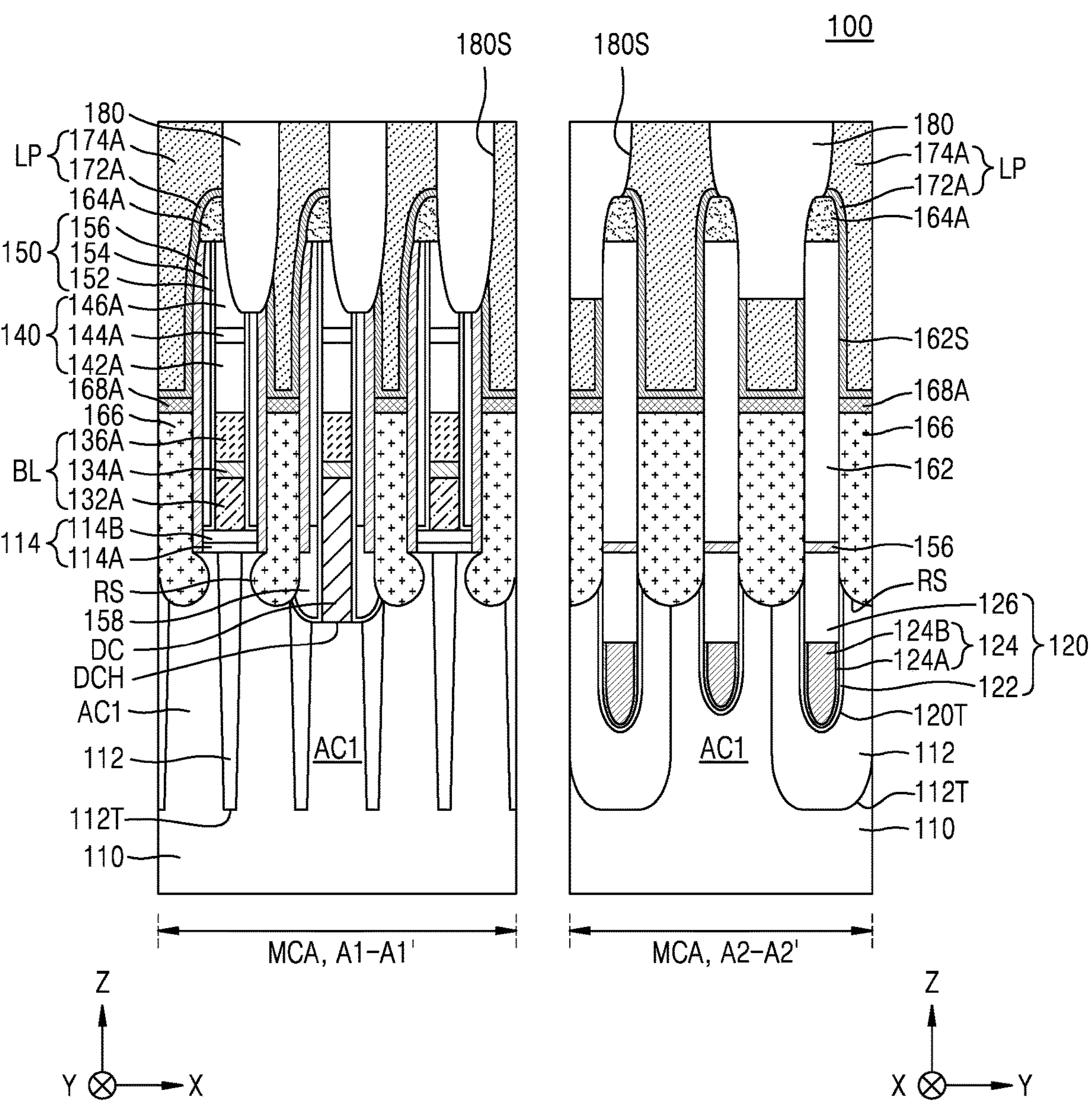
Figure 19B:
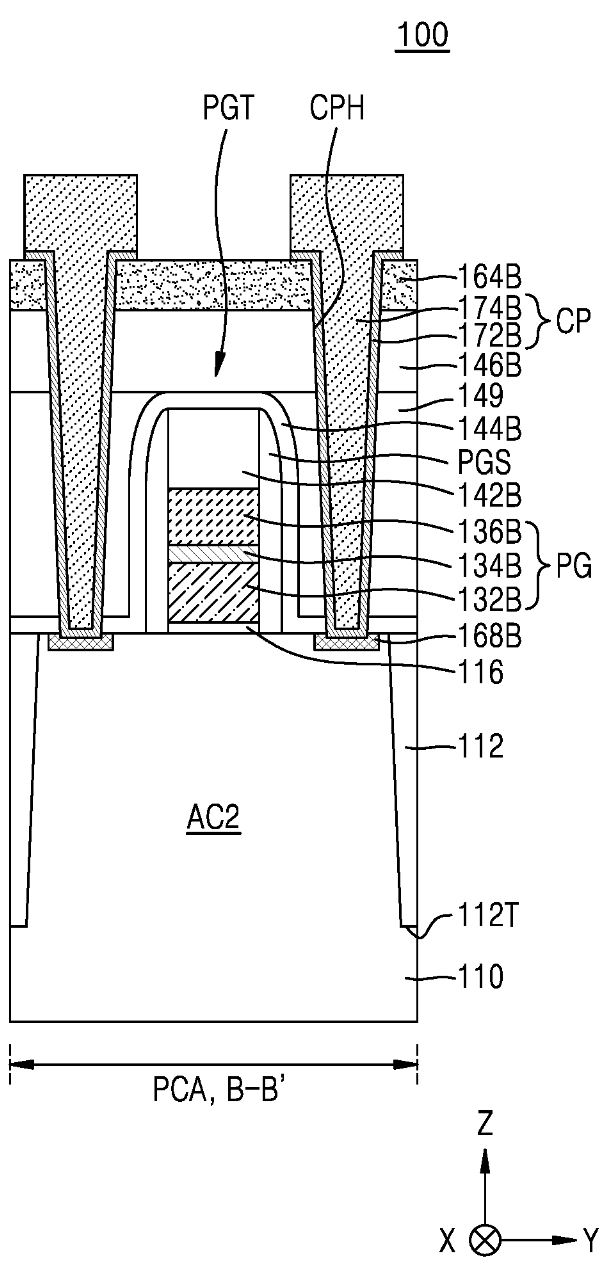

Referring to FIGS. 19A and 19B, by patterning the conductive barrier layer 172 and the conductive layer 174 in the cell array area MCA and the peripheral circuit area PCA, the plurality of landing pads LP including the conductive barrier layer 172A and the landing pad conductive layer 174A may be formed in the cell array area MCA, and a plurality of contact plugs CP including the conductive barrier layer 172B and the landing pad conductive layer 174B may be formed in the peripheral circuit area PCA. As seen in a plan view illustrated in FIG. 1, the plurality of landing pads LP may have a shape corresponding to a plurality of island patterns. The plurality of landing pads LP may be formed to vertically overlap some of the plurality of bit lines BL above the metal silicide layer 168A.

As the plurality of landing pads LP are formed in an island pattern shape, the insulation space 180S surrounding the plurality of landing pads LP may be formed, and at this time, the upper capping pattern 146A and the top capping layer 164A may be exposed at an inner wall of the insulation space 180S.

Subsequently, the insulation pattern 180 may be formed by using an insulating material on the inner wall of the insulation space 180S in the cell array area MCA. The insulation pattern 180 may be formed by a spin coating operation, a chemical vapor deposition (CVD) operation, a flowable CVD operation, or the like.

Subsequently, a capacitor lower electrode (not shown) may be formed on the plurality of landing pads LP in the cell array area MCA.

The integrated circuit device 100 may be completely formed by the manufacturing method described above.

According to the above-described manufacturing method, because the top capping layer 164A includes a material that is removed in a relatively small amount in the operation of forming the recess space RS, a height of the stack structure including the insulation capping structure 140 and the top capping layer 164A may be relatively small. Accordingly, an aspect ratio of the contact space 162S may be reduced, and an etching operation for forming the recess space RS may be precisely adjusted.

Figure 20:
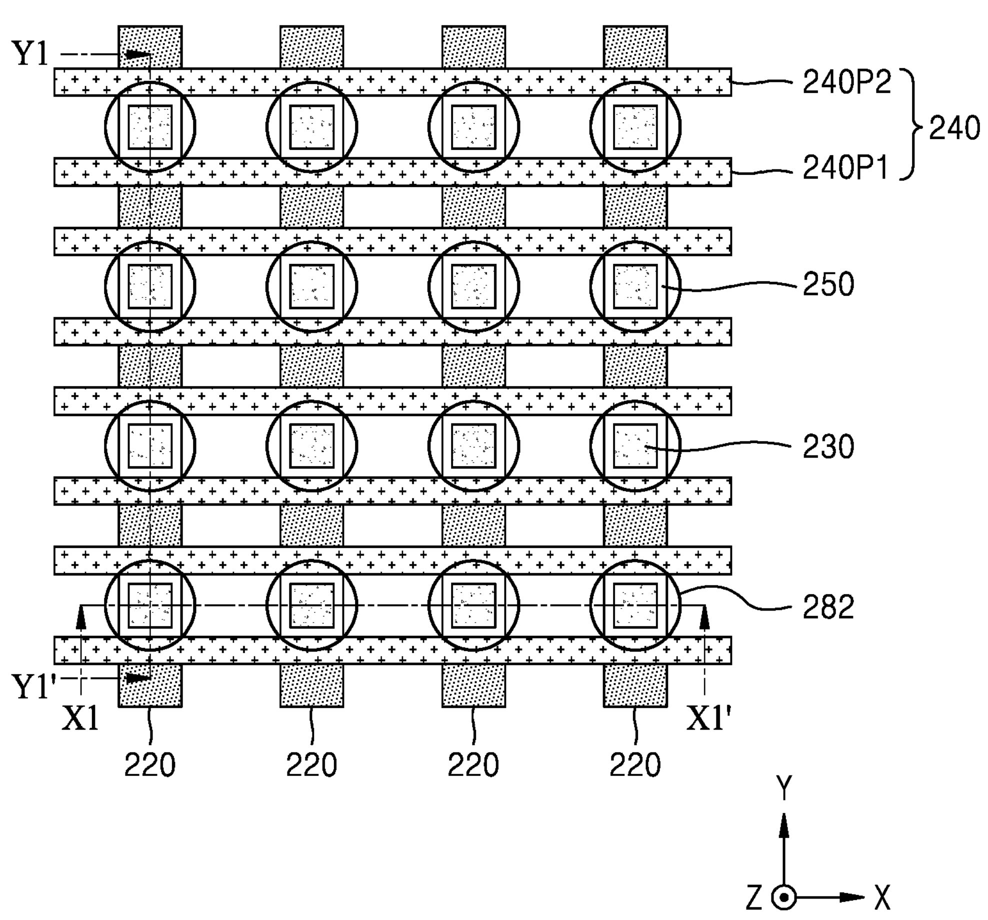
FIG. 20 is a layout diagram illustrating an integrated circuit device according to exemplary embodiments.
Figure 21:
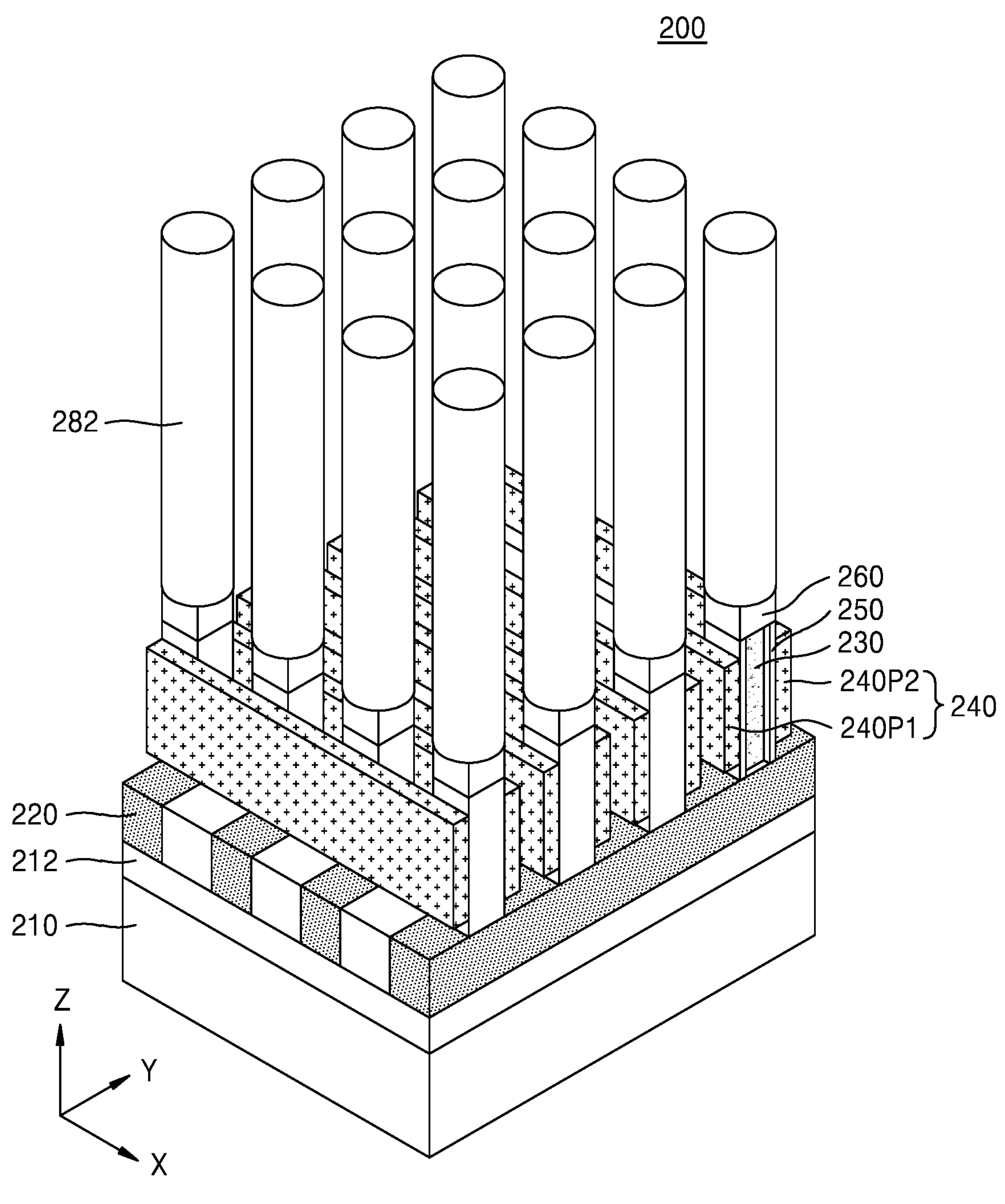
FIG. 21 is a perspective view of the integrated circuit device of FIG. 20.
Figure 22:
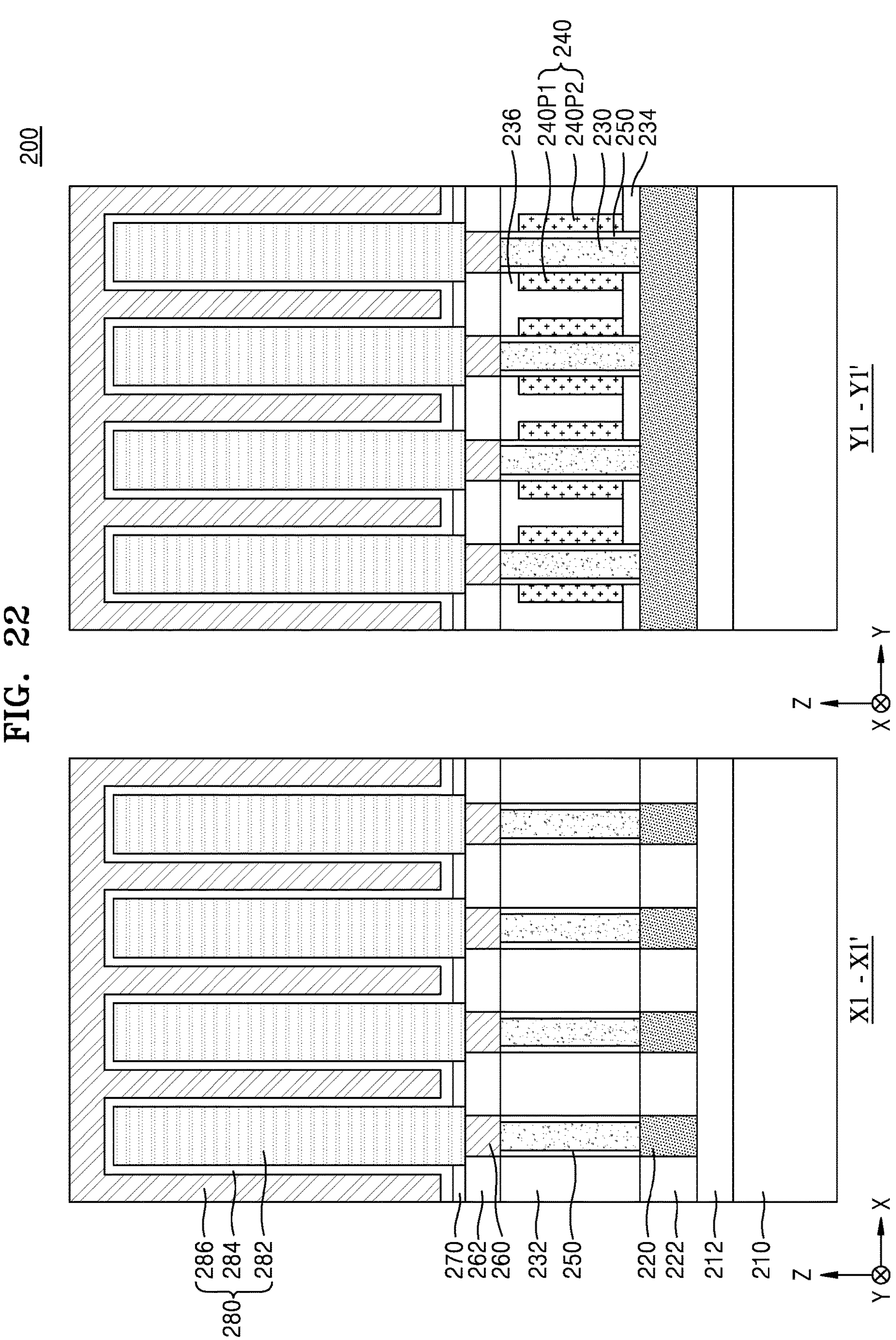
FIG. 22 illustrates cross-sectional views taken along lines X1-X1' and Y1-Y1' shown in FIG. 20.

FIG. 20 is a layout diagram illustrating an integrated circuit device 200 according to exemplary embodiments, FIG. 21 is a perspective view of the integrated circuit device 200, and FIG. 22 illustrates cross-sectional views taken along lines X1-X1' and Y1-Y1' shown in FIG. 20.

Referring to FIGS. 20 to 22, the integrated circuit device 200 may include a substrate 210, a plurality of first conductive lines 220, a channel layer 230, a gate electrode 240, a gate insulating layer 250, and a capacitor structure 280. The integrated circuit device 200 may be a memory device including a vertical channel transistor (VCT). The VCT may be referred to as a structure in which a channel length of the channel layer 230 extends in a vertical direction Z from the substrate 210.

A lower insulating layer 212 may be arranged on the substrate 210, and on the lower insulating layer 212, the plurality of first conductive lines 220 may be separated from one another in a first direction (X direction) and extend in a second direction (Y direction). A plurality of first insulating patterns 222 may be arranged on the lower insulating layer 212 to fill spaces between the plurality of first conductive lines 220. The plurality of first insulating patterns 222 may extend in a second direction (Y direction), and upper surfaces of the plurality of first insulating patterns 222 may be at a same level with upper surfaces of the plurality of first conductive lines 220. The plurality of first conductive lines 220 may function as bit lines of the integrated circuit device 200.

In exemplary embodiments, the plurality of first conductive lines 220 may include doped polysilicon, a metal, a conductive metal nitride, a conductive metal silicide, a conductive metal oxide, or a combination thereof. For example, the plurality of first conductive lines 220 may include doped polysilicon, Al, Cu, Ti, Ta, Ru, W, Mo, platinum (Pt), Ni, Co, TiN, TaN, WN, niobium nitride (NbN), titanium aluminide (TiAl), TiAlN, titanium silicide (TiSi), titanium silicium nitride (TiSiN), tantalum silicide (TaSi), tantalum silicium nitride (TaSiN), rutin titanium nitride (RuTiN), nickel silicide (NiSi), cobalt silicide (CoSi), $IrO_x$, $RuO_x$, or a combination thereof, but are not limited thereto. The plurality of first conductive lines 220 may include a single layer or multiple layers of the aforementioned materials. In exemplary embodiments, the plurality of first conductive lines 220 may include a two-dimensional (2D) semiconductor material, and for example, the 2D semiconductor material may include graphene or carbon nanotubes, or a combination thereof.

A plurality of channel layers 230 may be arranged in an island shape spaced apart from one another in the first direction X and the second direction Y on the plurality of first conductive lines 220. Each of the plurality of channel layers 230 may have a first width in the first horizontal direction X and a first height in a perpendicular direction Z, and the first height may be greater than the first width. For example, the first height may be about 2 to about 10 times the first width, but is not limited thereto. A bottom portion of the channel layer 230 may function as a first source/drain area (not shown), an upper portion of the channel layer 230 may function as a second source/drain area (not shown), and a portion of the channel layer 230 between the first and second source/drain areas may function as a channel area (not shown). The channel layer 230 may be formed by a patterning operation using a top capping layer M24 (refer to FIG. 25) and a lower mask layer M22 (refer to FIG. 25) as an etching mask. For example, the channel layer 230 may have a relatively large aspect ratio. For example, a patterning operation of the channel layer 230 may be precisely adjusted by a patterning operation using the top capping layer M24 and the lower mask layer M22 as an etching mask.

In exemplary embodiments, the channel layer 230 may include an oxide semiconductor, and for example, the oxide semiconductor may include $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$, or a combination thereof. The channel layer 230 may include a single layer or multiple layers of the oxide semiconductor. In some exemplary embodiments, the channel layer 230 may have a bandgap energy greater than that of silicon. For example, the channel layer 230 may have a band gap energy of about 1.5 eV to about 5.6 eV. For example, when the channel layer 230 has a band gap energy of about 2.0 eV to about 4.0 eV, the channel layer 230 may have an optimal channel performance. For example, the channel layer 230 may be polycrystalline or amorphous, but is not limited thereto. In exemplary embodiments, the channel layer 230 may include a two-dimensional semiconductor material, and for example, the two-dimensional semiconductor material may include graphene, carbon nanotubes, or a combination thereof.

The gate electrode 240 may extend in the first direction (X direction) on two sidewalls of the channel layer 230. The gate electrode 240 may include a first sub-gate electrode 240P1 facing a first sidewall of the channel layer 230 and a second sub-gate electrode 240P2 facing a second sidewall opposite to the first sidewall of the channel layer 230. As one channel layer 230 is arranged between the first sub-gate electrode 240P1 and the second sub-gate electrode 240P2, the integrated circuit device 200 may have a dual gate transistor structure. However, the inventive concept is not limited thereto, and a single gate transistor structure may be implemented by omitting the second sub-gate electrode 240P2 and forming only the first sub-gate electrode 240P1 facing the first sidewall of the channel layer 230.

The gate electrode 240 may include doped polysilicon, a metal, a conductive metal nitride, a conductive metal silicide, a conductive metal oxide, or a combination thereof. For example, the gate electrode 240 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, but is not limited thereto.

The gate insulating layer 250 may surround a sidewall of the channel layer 230, and may be arranged between the channel layer 230 and the gate electrode 240. For example, as shown in FIG. 20, all sidewalls of the channel layer 230 may be surrounded by the gate insulating layer 250, and a portion of a sidewall of the gate electrode 240 may contact the gate insulating layer 250. In other embodiments, the gate insulating layer 250 may extend in a direction in which the gate electrode 240 extends (that is, the first direction (X direction)), and among the sidewalls of the channel layer 230, only two sidewalls facing the gate electrode 240 may contact the gate insulating layer 250.

In exemplary embodiments, the gate insulating layer 250 may include a silicon oxide film, a silicon oxynitride film, a high-k dielectric film having a higher dielectric constant than that of the silicon oxide film, or a combination thereof. The high-k dielectric film may include a metal oxide or a metal oxynitride. For example, the high-k dielectric film usable as the gate insulating layer 250 may include $HfO_2$, HfSiO, HfSiON, HfTaO, HfTiO, HfZrO, $ZrO_2$, $Al_2O_3$, or a combination thereof, but is not limited thereto.

On the plurality of first insulating patterns 222, a plurality of second insulating patterns 232 may extend in the second direction (Y direction), and the channel layer 230 may be between two second insulating patterns 232 adjacent to each other among the plurality of second insulating patterns 232. In addition, a first buried layer 234 and a second buried layer 236 may be arranged in a space between two adjacent channel layers 230 next to each other, between two adjacent second insulating patterns 232. The first buried layer 234 may be arranged at the bottom portion of a space between two adjacent channel layers 230, and the second buried layer 236 may be formed to fill the rest of the space between two adjacent channel layers 230 on the first buried layer 234. An upper surface of the second buried layer 236 may be arranged at the same level as an upper surface of the channel layer 230, and the second buried layer 236 may cover an upper surface of the gate electrode 240. In contraposition, the plurality of second insulating patterns 232 may be formed as a material layer continuous with the plurality of first insulating patterns 222, or the second buried layer 236 may be formed as a material layer continuous with the first buried layer 234.

A capacitor contact 260 may be arranged on the channel layer 230. The capacitor contacts 260 may vertically overlap the channel layers 230, and may be arranged in the form of a matrix, in which the capacitor contacts 260 are apart from one another in the first direction (X direction) and the second direction (Y direction). The capacitor contact 260 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, but is not limited thereto. An upper insulating layer 262 may surround sidewalls of the capacitor contact 260 on the plurality of second insulating patterns 232 and the plurality of second buried layers 236.

An etch stop layer 270 may be arranged on the upper insulating layer 262, and a capacitor structure 280 may be arranged on the etch stop layer 270. The capacitor structure 280 may include a lower electrode 282, a capacitor dielectric layer 284, and an upper electrode 286.

The lower electrode 282 may penetrate the etch stop layer 270, and be electrically connected to an upper surface of the capacitor contact 260. The lower electrode 282 may be formed in a pillar type extending in the third direction Z, but is not limited thereto. In exemplary embodiments, the lower electrodes 282 may vertically overlap the capacitor contacts 260, and may be arranged in the form of a matrix, in which the lower electrodes 282 are apart from one another in the first direction (the X direction) and the second direction (the Y direction). In contraposition, a landing pad (not illustrated) may be further arranged between the capacitor contact 260 and the lower electrode 282 so that the lower electrode 282 is arranged in a hexagonal shape.

Figure 23:
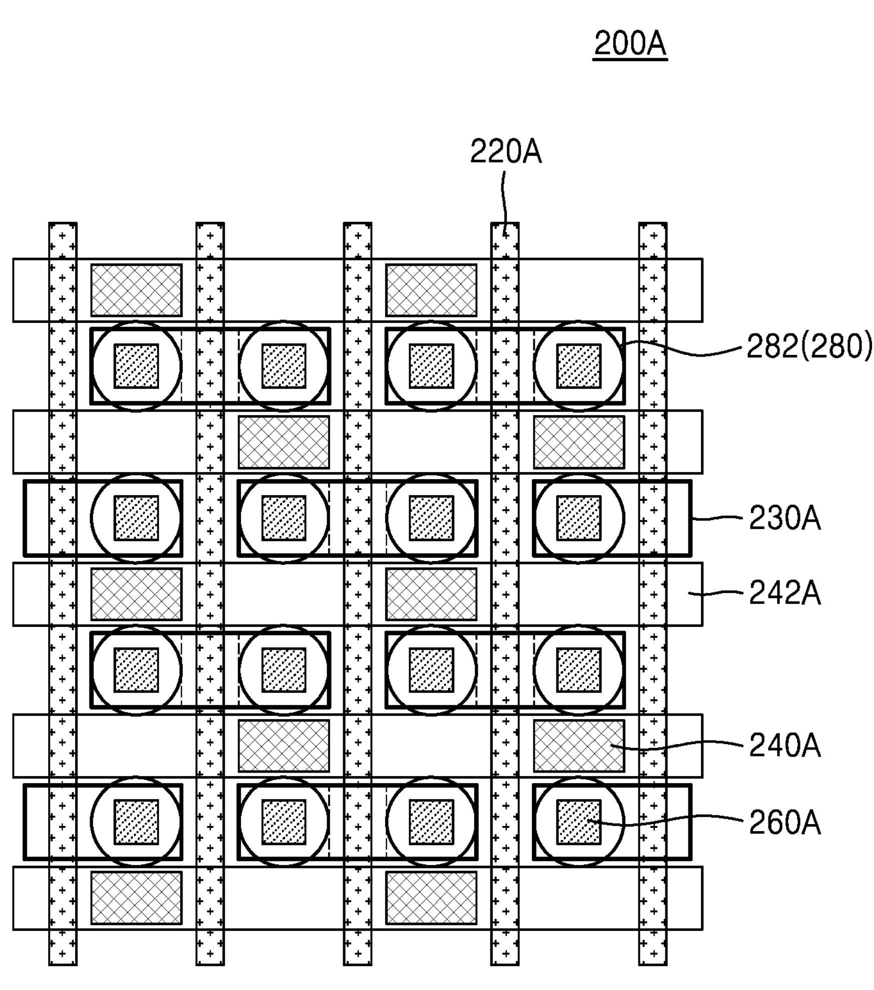
FIG. 23 is a layout diagram illustrating an integrated circuit device according to exemplary embodiments.
Figure 23:
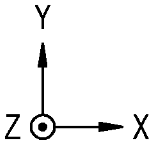
Figure 24:
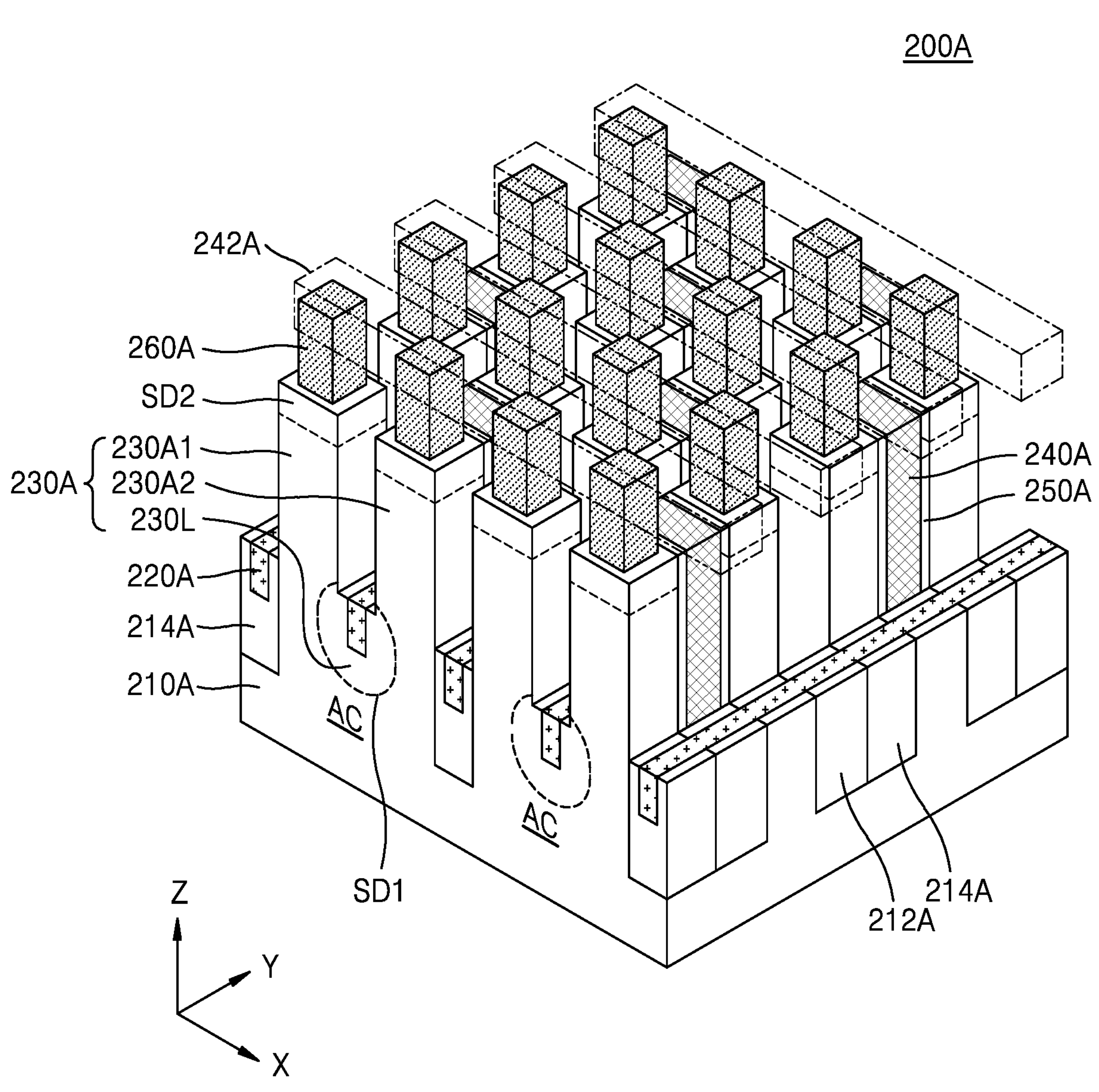
FIG. 24 is a perspective view of the integrated circuit device of FIG. 23.

FIG. 23 is a layout diagram of an integrated circuit device 200A according to exemplary embodiments, and FIG. 24 is a perspective view of the integrated circuit device 200A.

Referring to FIGS. 23 and 24, the integrated circuit device 200A may include a substrate 210A, a plurality of first conductive lines 220A, a channel structure 230A, a contact gate electrode 240A, a plurality of second conductive lines 242A, and the capacitor structure 280. The integrated circuit device 200A may be a memory device including the VCT.

A plurality of active areas AC may be defined on the substrate 210A by the first device isolation layer 212A and the second device isolation layer 214A. A channel structure 230A may be arranged in each of the plurality of active areas AC, and the channel structure 230A may include a first active pillar 230A1 and a second active pillar 230A2 each extending in the vertical direction Z, and a connection unit 230L connected to a bottom portion of the first active pillar 230A1 and a bottom portion of the second active pillar 230A2. A first source/drain area SD1 may be arranged in the connection unit 230L, and a second source/drain area SD2 may be arranged on the first active pillar 230A1 and the second active pillar 230A2. Each of the first active pillar 230A1 and the second active pillar 230A2 may form an independent unit memory cell.

The channel structure 230A may be formed by a patterning operation using the top capping layer M24 (refer to FIG. 25) and the lower mask layer M22 (refer to FIG. 25) as an etch mask. For example, the channel structure 230A may have a relatively large aspect ratio. For example, a patterning operation of the channel structure 230A may be precisely adjusted by a patterning operation using the top capping layer M24 and the lower mask layer M22 as an etch mask.

The plurality of first conductive lines 220A may extend in a direction crossing with each of the plurality of active areas AC, and may extend, for example, in the second direction (Y direction). Among the plurality of first conductive lines 220A, one first conductive line 220A may be arranged on the connection unit 230L between the first active pillar 230A1 and the second active pillar 230A2, and the one first conductive line 220A may be arranged on the first source/drain area SD1. Another first conductive line 220A adjacent to the one first conductive line 220A may be arranged between two channel structures 230A. Among the plurality of first conductive lines 220A, the one first conductive line 220A may function as a common bit line included in two unit memory cells, which are constructed by the first active pillar 230A1 and the second active pillar 230A2 at two sides of the one first conductive line 220A.

One contact gate electrode 240A may be disposed between two channel structures 230A that are adjacent to each other in the second direction (Y direction). For example, the contact gate electrode 240A may be arranged between the first active pillar 230A1 included in one channel structure 230A and the second active pillar 230A2 of the channel structure 230A adjacent to the first active pillar 230A1, and the one contact gate electrode 240A may be shared by the first active pillar 230A1 and the second active pillar 230A2 arranged on both sidewalls thereof. A gate insulating layer 250A may be arranged between the contact gate electrode 240A and the first active pillar 230A1, and between the contact gate electrode 240A and the second active pillar 230A2. The plurality of second conductive lines 242A may extend in the first direction (X direction) on upper surfaces of the contact gate electrodes 240A. The plurality of second conductive lines 242A may function as word lines of the integrated circuit device 200A.

A capacitor contact 260A may be arranged on the channel structure 230A. The capacitor contacts 260A may be arranged on the second source/drain area SD2 and the capacitor structure 280 may be arranged on the capacitor contact 260A.

Figure 25:
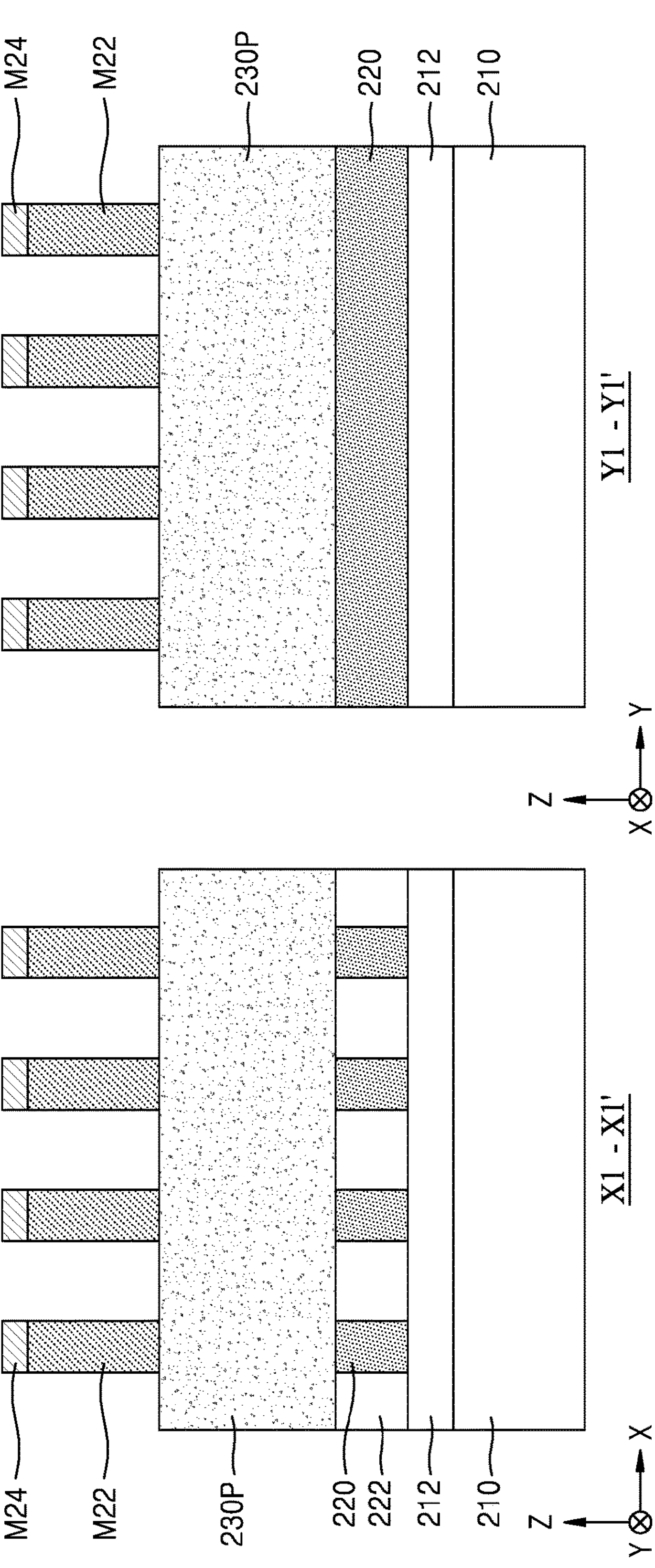
FIG. 25 is a cross-sectional view illustrating a method of manufacturing an integrated circuit device according to exemplary embodiments.

FIG. 25 is a cross-sectional view illustrating a method of manufacturing an integrated circuit device 200 according to exemplary embodiments.

Referring to FIG. 25, the lower insulating layer 212 may be formed on the substrate 210, and the plurality of first conductive lines 220 and the plurality of first insulating patterns 222 filling a space between the plurality of first conductive lines 220 may be formed on the lower insulating layer 212.

A channel material layer 230P may be formed on the plurality of first insulating patterns 222 and the plurality of first conductive lines 220. The lower mask layer M22 and the top capping layer M24 may be formed on the channel material layer 230P. The lower mask layer M22 may be formed by using a first insulating material, e.g., silicon nitride, and the top capping layer M24 may be formed by using a second insulating material different from the first insulating material, for example, titanium oxide. In a plan view, the lower mask layer M22 and the top capping layer M24 may be formed in an island shape.

Subsequently, the channel material layer 230P may be patterned by using the top capping layer M24 and the lower mask layer M22, thereby forming the channel layer 230 (refer to FIG. 21). The channel layer 230 may have a first width in the first horizontal direction X and a first height in the perpendicular direction Z, and the first height may be greater than the first width. For example, the first height may be about 2 to about 10 times the first width, but is not limited thereto. For example, the channel layer 230 may have a relatively large aspect ratio. For example, a patterning operation of the channel layer 230 may be precisely adjusted by a patterning operation using the top capping layer M24 and the lower mask layer M22 as an etch mask.

Referring back to FIG. 22, the gate insulating layer 250 and the gate electrode 240 may be formed on sidewalls of the channel layer 230, and first and second buried layers 234 and 236 each filling a space between the gate electrodes 240 may be formed. Subsequently, the capacitor contact 260 and the upper insulating layer 262 may be formed on the channel layer 230 and the first and second buried layers 234 and 236.

The integrated circuit device 200 may be completely formed by the manufacturing method described above.

While the inventive concept has been particularly shown and described with reference to embodiments thereof, it will be understood that various changes and modifications in form and details may be made therein without departing from the spirit and scope of the following claims.

What is claimed is:

1. An integrated circuit device, comprising:
- a substrate with an upper surface extending in a first direction and a second direction orthogonal to the first direction;
- a plurality of bit lines extending lengthwise on the substrate in the second direction parallel to the upper surface of the substrate;
- a plurality of insulation capping structures respectively arranged on the plurality of bit lines, wherein the plurality of insulation capping structures extend lengthwise in the second direction, and comprise a first insulating material;
- a conductive plug between a first bit line and a second bit line, among the plurality of bit lines on the substrate, wherein the first bit line and the second bit line are adjacent to each other and also adjacent to the conductive plug, wherein the conductive plug fills a recess space in the substrate;
- a top capping layer arranged on the plurality of insulation capping structures and comprising a second insulating material different from the first insulating material;
- a landing pad arranged on the conductive plug and covering at least a portion of the top capping layer;
- an insulation pattern surrounding a sidewall of the landing pad;
- at least one peripheral circuit gate structure on the substrate;
- an upper insulation capping layer covering the at least one peripheral circuit gate structure and comprising the first insulating material;
- a top protective layer arranged on the upper insulation capping layer and comprising the second insulating material; and
- a contact plug passing through the top protective layer and the upper insulation capping layer to be connected to the substrate.

2. The integrated circuit device of claim 1, further comprising:
- an insulating fence arranged between the first bit line and the second bit line among the plurality of bit lines on the substrate and in contact with a sidewall of the conductive plug.

3. The integrated circuit device of claim 2, wherein an upper surface of the insulating fence is on a same plane as an upper surface of each of the plurality of insulation capping structures, and
- the top capping layer covers the upper surface of the insulating fence and the upper surface of each of the plurality of insulation capping structures.

4. The integrated circuit device of claim 2, wherein the top capping layer has a curved sidewall on an upper surface of the insulating fence, and
- the top capping layer is arranged to vertically overlap the landing pad.

5. The integrated circuit device of claim 1, wherein the second insulating material comprises a material having an etch selectivity with respect to the first insulating material, and
- the second insulating material comprises a metal oxide.

6. The integrated circuit device of claim 5, wherein the first insulating material comprises silicon nitride, and the second insulating material comprises titanium oxide.

7. The integrated circuit device of claim 1, further comprising a spacer structure on both sidewalls of each of the plurality of bit lines,
- wherein a bottom surface of the top capping layer is in contact with an upper surface of the spacer structure.

8. The integrated circuit device of claim 1, wherein the top capping layer has a first thickness in a third direction perpendicular to the upper surface of the substrate, and
- the top protective layer has a second thickness, which is equal to the first thickness, in the third direction.

9. The integrated circuit device of claim 1, wherein the top protective layer is arranged to vertically overlap all of the at least one peripheral circuit gate structure.

10. An integrated circuit device, comprising:
- a substrate with an upper surface extending in a first direction and a second direction orthogonal to the first direction;
- a plurality of bit lines extending lengthwise on the substrate in the second direction parallel to the upper surface of the substrate;
- a plurality of insulation capping structures respectively arranged on the plurality of bit lines, wherein the plurality of insulation capping structures extend lengthwise in the second direction, and comprise a first insulating material;
- a plurality of insulating fences, wherein each insulating fence among the plurality of insulating fences is arranged between a first insulation capping structure and a second insulation capping structure among the plurality of insulation capping structures, wherein the plurality of insulating fences are spaced apart from one another in the second direction, and wherein the first insulation capping structure and the second insulation capping structure are adjacent to each other;

a top capping layer arranged on the plurality of insulation capping structures and the plurality of insulating fences and comprising a second insulating material different from the first insulating material;

a conductive plug between a first bit line and a second bit line among the plurality of bit lines, wherein the first bit line and the second bit line are adjacent to each other and also adjacent to the conductive plug and, wherein the conductive plug is between a first insulating fence and a second insulating fence among the plurality of insulating fences, wherein the conductive plug fills a recess space in the substrate;

a landing pad arranged on the conductive plug and covering at least a portion of an upper surface of the top capping layer;

an insulation pattern surrounding a sidewall of the landing pad;

at least one peripheral circuit gate structure on the substrate;

an upper insulation capping layer covering the at least one peripheral circuit gate structure and comprising the first insulating material;

a top protective layer arranged on the upper insulation capping layer and comprising the second insulating material; and a contact plug passing through the top protective layer and the upper insulation capping layer to be connected to the substrate.

11. The integrated circuit device of claim 10, further comprising:

a spacer structure on both sidewalls of each of the plurality of bit lines, wherein the top capping layer is on an upper surface of the spacer structure.

12. The integrated circuit device of claim 10, wherein an upper surface of each of the plurality of insulating fences is on a same plane as an upper surface of each of the plurality of insulation capping structures, and the top capping layer covers the upper surface of each of the plurality of insulating fences and the upper surface of each of the plurality of insulation capping structures.

13. The integrated circuit device of claim 10, wherein the top capping layer has a curved sidewall on an upper surface of each of the plurality of insulating fences.

14. The integrated circuit device of claim 10, wherein the top capping layer has a first thickness in a third direction perpendicular to the upper surface of the substrate, and the top protective layer has a second thickness, which is equal to the first thickness, in the third direction.

15. An integrated circuit device, comprising:

a substrate with an upper surface extending in a first direction and a second direction orthogonal to the first direction;

a plurality of bit lines extending lengthwise on the substrate in the second direction parallel to the upper surface of the substrate;

a plurality of insulation capping structures respectively arranged on the plurality of bit lines, extending lengthwise in the second direction, and comprising a first insulating material;

a plurality of insulating fences, wherein each insulating fence among the plurality of insulating fences is arranged between a first insulation capping structure and a second insulation capping structure among the plurality of insulation capping structures, wherein the plurality of insulating fences are spaced apart from one another in the second direction, and wherein the first insulation capping structure and the second insulation capping structure are adjacent to each other;

a top capping layer arranged on the plurality of insulation capping structures and the plurality of insulating fences and comprising a second insulating material different from the first insulating material;

a conductive plug between a first bit line and a second bit line among the plurality of bit lines, wherein the first bit line and the second bit line are adjacent to each other and also adjacent to the conductive plug and, wherein the conductive plug is between a first insulating fence and a second insulating fence among the plurality of insulating fences, wherein the conductive plug fills a recess space in the substrate;

a landing pad arranged on the conductive plug and covering at least a portion of an upper surface of the top capping layer;

an insulation pattern surrounding a sidewall of the landing pad;

at least one peripheral circuit gate structure on the substrate;

an upper insulation capping layer covering the at least one peripheral circuit gate structure and comprising the first insulating material;

a top protective layer arranged on the upper insulation capping layer and comprising the second insulating material; and a contact plug passing through the top protective layer and the upper insulation capping layer to be connected to the substrate, wherein the second insulating material comprises a material having an etch selectivity with respect to the first insulating material.

16. The integrated circuit device of claim 15, wherein the first insulating material comprises silicon nitride, and the second insulating material comprises titanium oxide.

17. The integrated circuit device of claim 15, wherein an upper surface of each insulation capping structure of the plurality of insulation capping structures is at a same level as an upper surface of each insulating fence of the plurality of insulating fences, and the top capping layer is arranged to vertically overlap the landing pad.

18. The integrated circuit device of claim 15, further comprising a spacer structure on both sidewalls of each of the plurality of bit lines, wherein a bottom surface of the top capping layer is in contact with an upper surface of the spacer structure.

* * * * *